United States Patent
Mathew et al.

(10) Patent No.: US 9,733,670 B2
(45) Date of Patent: Aug. 15, 2017

(54) COMPUTER DISPLAY OR COVER GLASS/CELL ATTACHMENT TO FRAME

(71) Applicant: Apple Inc., Cupertino, CA (US)

(72) Inventors: Dinesh C. Mathew, Fremont, CA (US); Edward J. Cooper, Menlo Park, CA (US); Brett W. Degner, Menlo Park, CA (US); Keith J. Hendren, San Francisco, CA (US); Nicholas Alan Rundle, San Jose, CA (US); Dave Tarkington, Sunnyvale, CA (US)

(73) Assignee: Apple Inc., Cupertino, CA (US)

(*) Notice: Subject to any disclaimer, the term of this patent is extended or adjusted under 35 U.S.C. 154(b) by 290 days.

(21) Appl. No.: 13/627,814

(22) Filed: Sep. 26, 2012

(65) Prior Publication Data

US 2014/0085796 A1    Mar. 27, 2014

(51) Int. Cl.
*G06F 1/16* (2006.01)
*H05K 13/00* (2006.01)
*H04N 5/64* (2006.01)

(52) U.S. Cl.
CPC ............. *G06F 1/1637* (2013.01); *G06F 1/16* (2013.01); *G06F 1/1601* (2013.01); *G06F 1/1607* (2013.01); *G06F 1/1609* (2013.01); *H04N 5/64* (2013.01); *H05K 13/00* (2013.01); *G06F 2200/1612* (2013.01); *Y10T 29/49002* (2015.01)

(58) Field of Classification Search
CPC ........ G06F 1/16; G06F 1/1601; G06F 1/1607; G06F 1/1609; G06F 1/1637; H05K 13/00
USPC .......... 361/679.21, 679.01–679.02, 361/679.06–679.07, 679.09, 679.22, 361/679.26–679.3, 679.55–679.56, 679.6; 29/592.1; 345/173, 176
See application file for complete search history.

(56) References Cited

U.S. PATENT DOCUMENTS

| | | | |
|---|---|---|---|
| 6,116,774 A | 9/2000 | Sasaki et al. | |
| 7,145,766 B2 | 12/2006 | Homer et al. | |
| 7,965,498 B2 * | 6/2011 | Gotham et al. | 361/679.21 |
| 2009/0103261 A1 * | 4/2009 | Shih | E05C 19/16 361/679.58 |

(Continued)

FOREIGN PATENT DOCUMENTS

| | | | | |
|---|---|---|---|---|
| CA | 2733236 A1 * | 9/2011 | | G06F 1/1626 |
| EP | 1633176 B1 | 4/2007 | | |
| WO | WO 2011031506 A2 * | 3/2011 | | |

*Primary Examiner* — Courtney Smith
*Assistant Examiner* — Zhengfu Feng
(74) *Attorney, Agent, or Firm* — Zachary D. Hadd; David K. Cole

(57) ABSTRACT

The described embodiments relate generally to computing devices including liquid crystal displays (LCDs) and more particularly to methods for attaching a cover glass layer to a structural housing while minimizing an amount of stress transferred through the cover glass layer to the LCD module. A continuous and compliant foam adhesive can be used to bond the cover glass layer to a structural. The compliant bond can absorb and distribute local stress concentrations caused by structural loads, mismatched surfaces and differing thermal expansion rates between various structures and cover glass layer. This can reduce stress concentrations in the cover glass layer that can lead to stress induced birefringence in the LCD cell. In other embodiments, the cover glass layer can be attached using magnets or a tongue and groove design.

19 Claims, 18 Drawing Sheets

(56) References Cited

U.S. PATENT DOCUMENTS

2009/0257189 A1* 10/2009 Wang et al. ............. 361/679.56
2010/0079404 A1*  4/2010 Degner et al. ............... 345/174
2011/0109829 A1*  5/2011 Mathew et al. ............... 349/58
2011/0261510 A1* 10/2011 Liu .......................... 361/679.01
2012/0050958 A1*  3/2012 Sanford ................ G06F 1/1626
                                              361/679.01

* cited by examiner

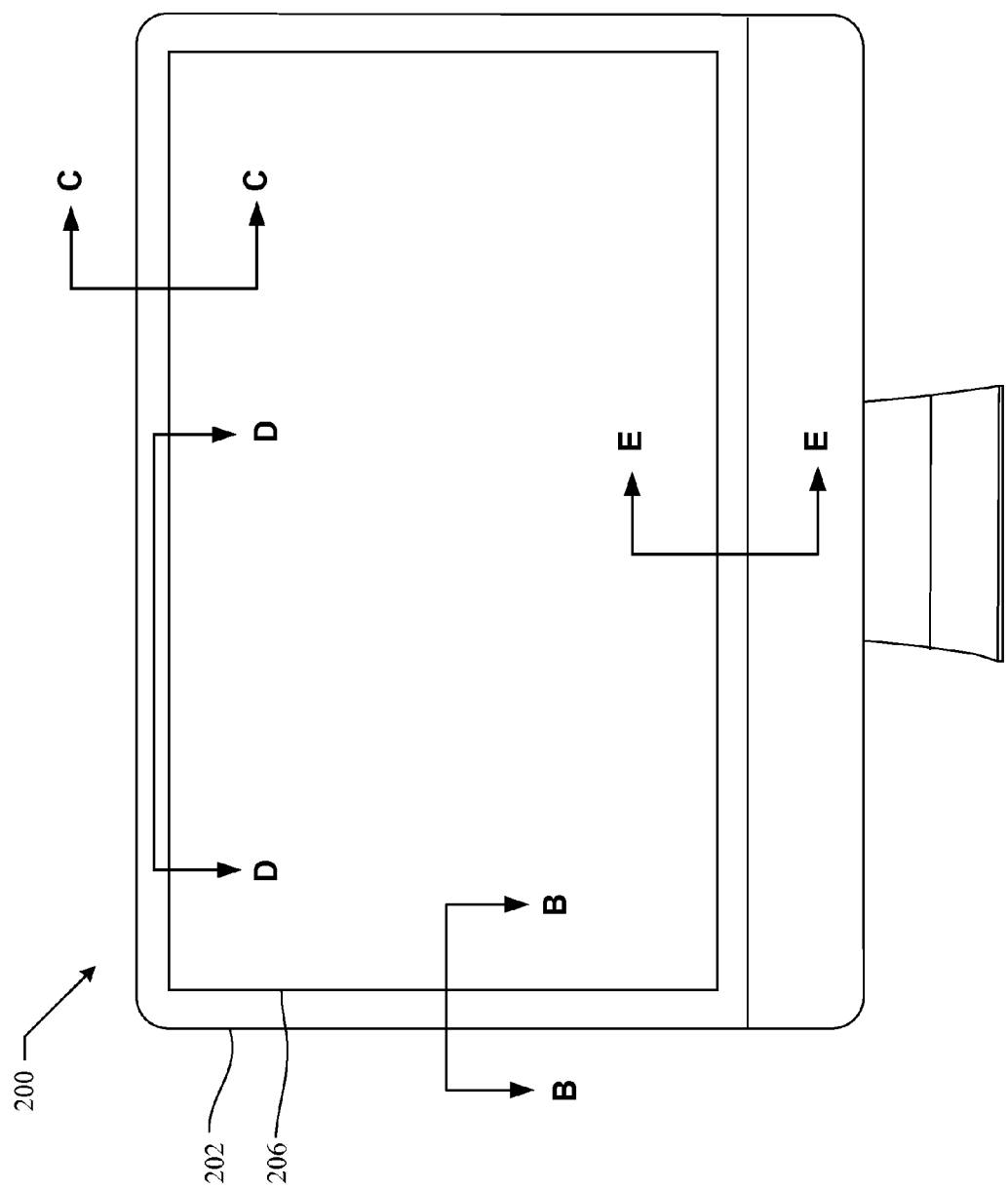

(B – B)

(C – C)

(D-D)

(E-E)

COMPUTER DISPLAY OR COVER GLASS/CELL ATTACHMENT TO FRAME

FIELD OF THE DESCRIBED EMBODIMENTS

The described embodiments relate generally to computing devices including liquid crystal displays (LCDs) and more particularly to methods for attaching a cover glass layer to a structural housing while minimizing an amount of stress transferred to the cover glass layer.

BACKGROUND

LCD modules are commonly used in a variety of consumer electronics devices including televisions, computer monitors, laptop computers and mobile devices. A typical LCD module can include an LCD cell, backlight and electronics. Many devices including LCD modules can protect the LCD cell by placing a layer of cover glass in front of the LCD module. For cosmetic reasons, it can be advantageous for the cover glass layer to extend to an edge of a front face of the device. Moreover, space limitations can favor designs in which the LCD module and cover glass are as thin as possible, resulting in a reduced overall thickness for the device.

Conventional devices containing LCD modules can leave an air gap between the LCD module and the cover glass layer. There can be several advantages to eliminating this air gap by bonding the LCD cell directly to the cover glass layer. Elimination of the air gap can reduce the thickness of the LCD module, resulting in an overall decreased thickness for the device in which it is contained. Additionally, bonding the LCD cell to the cover glass layer can improve front of screen performance. For example, an image produced by the LCD cell can be brought closer to the front of the device. Furthermore, reflections can be reduced and a likelihood of foreign material or condensation collecting between glass layers can be decreased. However, a mechanical coupling between the LCD cell and cover glass layer can allow stresses imparted on the cover glass to result in unwanted stress on the LCD cell. The LCD cell can operate by selectively rotating an angle of incidence of polarized light as the light passes through two polarizers oriented at 90° to one another. When stress is imparted on liquid crystals within the LCD cell, the angle at which light is rotated as it passes through the liquid crystals can change in a process known as stress induced birefringence. This change in angle can locally increase or decrease an amount of light being emitted by a region of the LCD cell, causing a visible distortion in an image produced by the LCD cell.

When the LCD cell is bonded to the cover glass layer, any stresses imposed on the cover glass layer can be transmitted to the LCD cell, increasing the risk that stress induced birefringence can occur. This can be particularly true when the LCD module is large, such as those used in desktop computers, computer monitors and televisions. Larger devices can weigh more and require the cover glass layer to sustain loads over longer distances. This can increase localized stress on the cover glass layer at points where the cover glass layer is attached to other structures. Moreover, when the cover glass layer is extended to an edge of a device, the cover glass layer itself can become a structural member in the housing of the device, further increasing the likelihood that stress induced birefringence will occur.

Therefore, what is desired is a method for attaching a cover glass layer with a bonded LCD cell to a device housing and backlight assembly while minimizing the amount of localized stress concentrations imparted to the cover glass and LCD cell.

SUMMARY OF THE DESCRIBED EMBODIMENTS

In one embodiment, a computing device is described. The computing device can include a structural housing forming an exterior surface of the computing device. The structural housing can be integrally coupled to a chin structure located along a bottom edge. Furthermore, the structural housing and the chin structure can include an opening surrounded by a support block. The support block can include a first surface configured to couple to a cover glass layer and a second surface coupled to the structural housing. The cover glass layer can then be coupled to the support block using a cover glass attachment mechanism. In one embodiment, the cover glass attachment mechanism can include a compliant foam adhesive configured to reduce an amount of point loads that can be transferred from the structural housing to the cover glass layer. In another embodiment, the cover glass attachment mechanism can include magnets coupled to the support block and magnetic material coupled to the cover glass layer.

In another embodiment, an alternative computing device is described. The computing device can include a structural housing forming an exterior surface of the computing device. The structural housing can be integrally coupled to a chin structure located along a bottom edge. Furthermore, the structural housing and the chin structure can include an opening surrounded by a support block. The support block can include a first surface configured to couple to a cover glass layer, a second surface coupled to the structural housing, and a groove along an interior surface of one side. A cover glass layer can be configured to fit within the opening and bonded to one or more tongues that are configured to engage with the groove in the support block. The cover glass layer and tongues can then be aligned with the groove and the cover glass layer can rotate down to rest on a foam pad bonded to the first surface of the support block. The cover glass layer can be fastened to the chin structure to prevent movement.

In still another embodiment, a method for attaching a cover glass layer to a structural housing using a cover glass attachment mechanism is described. The method can be carried out by performing at least the following operations: receiving a structural housing coupled to a chin structure and including a front opening, coupling a first surface of the support block to the structural housing, machining a second surface of the support block to provide a surface to support the cover glass layer, and coupling the cover glass layer to the support block using a cover glass attachment mechanism. The cover glass attachment mechanism can be configured to reduce an amount of point loads that can be transferred from the structural housing to the cover glass layer. In one embodiment, the cover glass attachment mechanism can include a compliant foam adhesive configured to reduce an amount of point loads that can be transferred from the structural housing to the cover glass layer. In another embodiment, the cover glass attachment mechanism can include magnets coupled to the support block and magnetic material coupled to the cover glass layer.

In still another embodiment, a method for attaching a cover glass layer to a structural housing using a cover glass attachment mechanism is described. The method can be carried out by performing at least the following operations: receiving a structural housing coupled to a chin structure and including a front opening, coupling a first surface of the support block to the structural housing, machining a second surface of the support block and bonding the second surface to a foam pad, creating a groove along an interior surface of one side of the support block, bonding one or more tongues to the cover glass layer, inserting the tongues into the groove so the cover glass layer can rotate down and rest on the foam pad, and fastening the cover glass layer to the chin structure. The foam pad can reduce an amount of point loads that can be transferred from the structural housing to the cover glass layer.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

FIG. 2A shows a front view of a computing device in which the present disclosure can be implemented and provides context for FIGS. 2B-2E.

DETAILED DESCRIPTION OF SELECTED EMBODIMENTS

Figure 1:
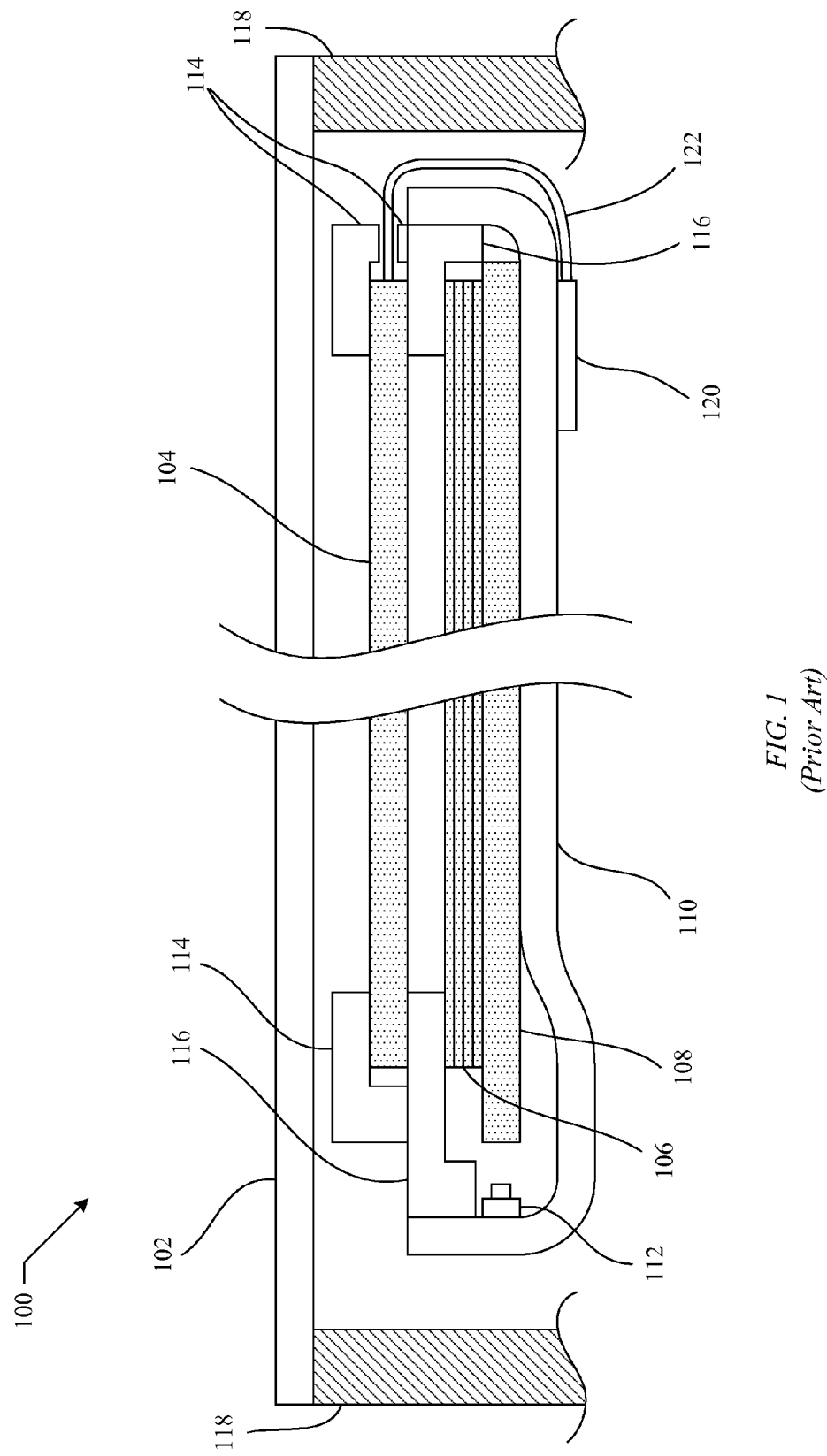
FIG. 1 shows a cross-sectional view of a prior art LCD module and cover glass assembly.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

LCD modules can be used in a large number of devices in the consumer electronics industry including computer monitors, laptop computers, mobile phones, handheld video game systems, navigation systems and televisions. LCD modules can include an LCD cell, backlight assembly, and electronics. As devices containing LCD modules become smaller, it can be advantageous to decrease the thickness of the LCD module to reduce the overall thickness of the device. Conventional LCD modules can include multiple air gaps in between components such as the light guide, LCD cell and a cover glass layer. These gaps can increase a number of air to glass interfaces within the LCD module, which can lead to higher levels of reflection and refraction. Moreover, air gaps can increase the thickness of the LCD module, resulting in a larger device. Therefore, designs that decrease the number of air gaps and reduce the thickness of the LCD module can improve device performance and enhance the user experience.

One approach to reducing the thickness of the LCD module can be to attach components of the LCD module directly to the cover glass layer. The LCD cell can be bonded directly to the cover glass layer and the backlight assembly can be attached either to the LCD cell or to the cover glass layer around the LCD cell. This approach can reduce module thickness and decrease the number of air gaps. However, attachment of the LCD cell to the cover glass layer can negatively impact operation of the LCD cell if sufficient stress imparted on the cover glass layer is transmitted to the LCD cell. The LCD cell can operate by selectively rotating an angle of incidence of polarized light as the light passes through two polarizers oriented at 90° to one another. When stress is imparted on liquid crystals within the LCD cell, the angle at which light is rotated as it passes through the liquid crystals can change in a process known as stress induced birefringence. This change in angle can locally increase or decrease an amount of light being emitted by a region of the LCD cell, causing a visible distortion in an image produced by the LCD module.

One solution to this problem can be attaching the cover glass layer to the backlight assembly and a structural housing using a continuous and compliant foam adhesive. The foam adhesive can absorb and distribute local stress concentrations caused by structural loads, mismatched surfaces and differing thermal expansion rates. In another embodiment, rigid plates can be attached to the cover glass layer and include all attachment points for the backlight assembly. The rigid plates can evenly distribute any point loads applied from the backlight assembly across the cover glass layer, reducing the risk that an area of the LCD cell can experience stress induced birefringence.

FIG. 1 shows a cross-sectional view of prior art device 100, including an LCD module and a cover glass layer. Cover glass layer 102 can be formed from any optically clear and robust material such as glass, plastic, or various polymer-based materials. Cover glass layer 102 can be supported on structural frame 118 and is not mechanically attached to the LCD module. Structural frame 118 can represent an exterior housing or an interior structural support to device 100. The LCD module can be supported by support frame 110. Support frame 110 can be made from metal such as aluminum or any suitable rigid material.

Illumination source 112 can be coupled to support frame 110 and can represent any suitable light source, including light emitting diodes (LEDs), fluorescent lamps, incandescent light bulbs, and electroluminescent panels. Illumination source 112 can supply light to light guide 108 which, in turn, can diffuse the light across the LCD module and direct the light through optical films 106. Light guide 108 and optical films 106 can be held in place by backlight bracket 116. LCD cell 104 can be fixed in place by an upper surface of backlight bracket 116 and LCD cell bracket 114. LCD cell 104 can include liquid crystals, a thin film transistor (TFT) glass layer for directing signals to and activating the liquid crystals, a color filter, and an upper polarizer layer. A gap can be included in LCD cell bracket 114 to accommodate flex cable 122. Flex cable 122 can send signals from LCD driver integrated chip (IC) 120 to the TFT glass layer. Driver IC 120 can be attached to support frame 110 or any other suitable location.

The lack of a mechanical connection between cover glass layer 102 and LCD cell 104 can prevent any stress imparted on cover glass 102 from producing stress induced birefringence in LCD cell 104. However, device 100 can have air gaps between cover glass layer 102, LCD cell 104, and optical films 106. These air gaps can increase the thickness of the LCD module, and the overall thickness of device 100. Moreover, multiple air to glass transitions can cause increased reflections and refractions that can degrade the user experience. Therefore, it can be desirable to develop a method for reducing the number of air gaps in device 100 and decreasing the thickness of the LCD module while continuing to prevent stress in cover glass 102 from affecting the performance of LCD cell 104.

Figure 2B:
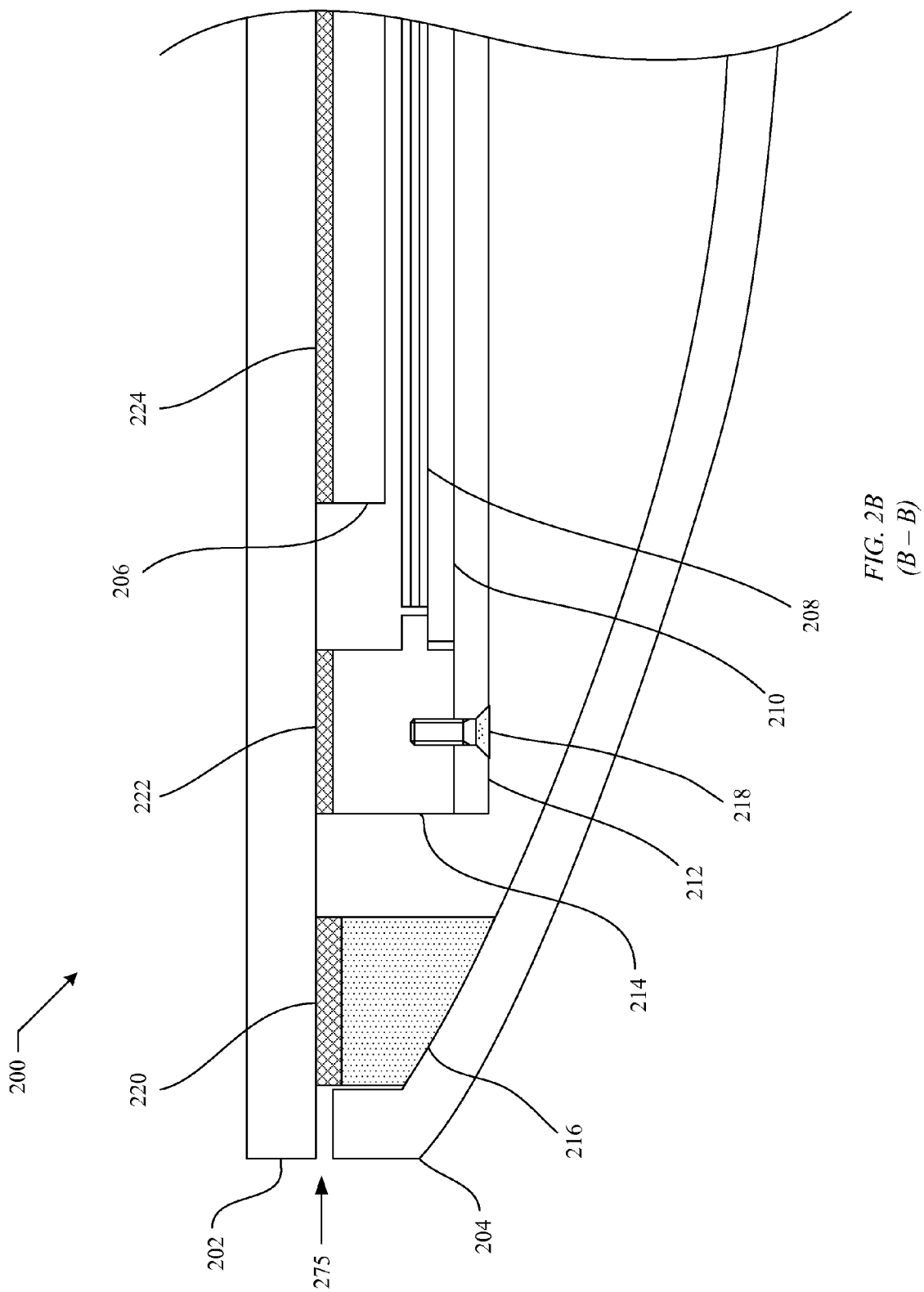
FIG. 2B shows a cross-sectional view along an edge of a computing device including an LCD module.

FIG. 2A shows a front view of computing device 200, incorporating methods included in the present disclosure. However, the included methods can be used in devices other than desktop computers and the present disclosure includes other types of devices using LCD modules such as laptop computers and televisions. Cover glass layer 202 can form a front surface for much of computing device 200 and can extend to an edge of computing device 200 on a top edge and two side edges. Extending cover glass layer 202 to an edge of computing device 200 can enhance the user experience by providing an aesthetically pleasing look and maximizing use of available space for viewing. However, the extension of cover glass layer 202 to an edge of computing device 200 is not required and the present disclosure can include devices in which cover glass layer 202 extends to none or any number of edges. LCD cell 206 can be located behind cover glass layer 202 and provide a visible viewing area for the LCD module. Views B-B, C-C, D-D, and E-E provide reference for FIGS. 2B, 2C, 2D, and 2E respectively.

FIG. 2B shows a cross-sectional view of computing device 200 along a side edge as is shown in FIG. 2A, view B-B. Cover glass layer 202 can extend to an edge of computing device 200 and can be formed from any optically clear and robust material such as glass, plastic, or various polymer-based materials. LCD cell 206 can be bonded to cover glass layer 202 using optically clear adhesive (OCA) 224. OCA 224 can represent an optically clear tape, liquid OCA such as acrylic or silicone, or any other suitable transparent adhesive. LCD cell 206 can include liquid crystals, a thin film transistor (TFT) glass layer for directing signals to and activating the liquid crystals, a color filter, and an upper polarizer layer. There can be several advantages to bonding LCD cell 206 directly to cover glass layer 202. First, bonding LCD cell 206 can remove an air gap in the LCD module and can eliminate the need for LCD cell bracket 114 shown in FIG. 1. This can reduce the thickness of the LCD module, leaving more space for other components or allowing for computing device 200 to have a smaller size. Second, the removal of the air gap between LCD cell 206 and cover glass layer 202 can reduce an amount of reflections visible to a user of computing device 200 by decreasing the number of air to glass transitions that light must pass through. Finally, the removal of the air gap can prevent foreign materials or particles from entering a space between cover glass 202 and LCD cell 206. When foreign materials such as dust enter this space, a distortion can be created on a viewing surface of the LCD module. By bonding cover glass layer 202 and LCD cell 206 together in a clean environment, a risk of foreign particles entering the space can be reduced.

A backlight assembly can include optical films 208, light guide 210, and support frame 212. Light guide 210 can be formed from a plastic and configured to diffuse light from an illumination source across the LCD module. Optical films 208 can condition the light from the light guide before passing the light through to LCD cell 206. Support frame 212 can provide a rigid support for light guide 210 and optical films 208, and can be formed from any robust material. In one embodiment, support frame 212 can be formed from an electrically and thermally conductive material such as aluminum. Then, support frame 212 can also function as an EMI shield and heat sink for the LCD module.

The backlight assembly can be coupled to cover glass layer 202 by mounting bracket 214. Mounting bracket 214 can extend around a periphery of LCD cell 206. Furthermore, mounting bracket 214 can be formed from any suitably rigid and robust material. However selecting a material with a similar coefficient of thermal expansion as cover glass 202 can be advantageous for reducing stress concentrations in cover glass layer 202. In one embodiment, a glass fiber reinforced plastic material can be used to closely match the thermal expansion properties of cover glass layer 202. Mounting bracket 214 can be bonded to cover glass layer 202 using foam adhesive 222. Foam adhesive 222 can form a continuous and compliant bond along a periphery of the backlight assembly.

There can be several advantages to using foam adhesive 222 to bond mounting bracket 214 to cover glass layer 202. First, foam adhesive 222 can be selected to have sufficient compliance to absorb any unevenness or difference in shape between cover glass layer 202 and mounting bracket 214, reducing a likelihood of stress concentrations. Second, foam adhesive 222 can distribute any loads applied through mounting bracket 214 over a large area of cover glass layer 202. Finally, foam adhesive 222 can compensate for any remaining difference in thermal expansion rates between cover glass layer 202 and mounting bracket 214, further reducing stress concentrations that can affect the performance of LCD cell 206.

Foam adhesive 222 can be made from any compliant adhesive. In one embodiment, a layer of foam impregnated with an adhesive can be used. In another embodiment, a layer of foam with adhesive tape affixed to both surfaces can be used as well. When selecting a material for foam adhesive 222, it can be important to balance compliance and reliability requirements for a particular device or application. For example, a device with low tolerances on a bonding surface or high disparities in thermal expansion rates may need a higher degree of compliance in foam adhesive 222. However, a device in which foam adhesive 222 can support a significant amount of weight may require a lower degree of compliance to prevent shear forces from deforming foam adhesive 222 over time.

Mounting bracket 214 can be coupled to support frame 212 using any robust means. However, it can be advantageous for rework and repair of the LCD module to attach mounting bracket 214 to support frame 212 using an easily reversible process. For example, a common problem requiring rework can be removing foreign materials or dust particles from light guide 210. By making support frame 212 easily detachable from mounting bracket 214, the backlight assembly can be quickly removed from computing device 200 to address the problem. In one embodiment, support frame 212 can be fastened to mounting bracket 214 using fasteners 218 spaced evenly around a periphery of support frame 212. Fasteners 218 can be quickly and easily removed to access the LCD module if necessary for rework or repair.

In addition to mounting bracket 214, foam adhesive 220 can be used to bond cover glass layer 202 to structural housing 204. Structural housing 204 can form a main structural support for computing device 200. In one embodiment, structural housing 204 can form an exterior surface of computing device 200 along the sides and back. In another embodiment, structural housing 204 can be an internal structural component.

Support block 216 can be used to provide a surface to bond to cover glass layer 202 to structural housing 204. Support block 216 can be disposed around the periphery of structural housing 204. In one embodiment, a periphery of exterior housing 204 and support block 216 can be machined at the same time during manufacturing to provide a uniform plane for supporting cover glass layer 202. In another embodiment, a stepped cutter can be used to cut a face of support block 216 with respect to an edge of structural housing 204. In this manner, a cosmetic gap 275 can be well controlled by controlling the height of support block 216 with respect to an edge of structural housing 204.

Support block 216 can be formed from any robust material. In one embodiment, support block 216 can be formed from glass fiber reinforced plastic material to closely match the thermal expansion properties of cover glass 202. For example, a material such as Ixef polyarylamide which typically contains about 50-60% glass fiber reinforcement can closely mimic the thermal expansion properties of many cover glass materials. Furthermore, support block 216 can coupled to structural housing 204 using any technically feasible method such as bonding with an adhesive, welding (when the support block 216 is formed from metal or a metal alloy) or support block 216 can be drilled and tapped and held in place with one or more screws inserted through structural housing 204. Foam adhesive 220 can operate similarly to foam adhesive 222, providing compliance to reduce any transfer of stress from structural housing 204 to cover glass layer 202. This can include reductions in stress concentrations due to uneven mating surfaces, structural loads, and varying thermal expansion rates. By reducing stress concentrations in cover glass layer 202, the likelihood that stress induced birefringence will occur in LCD cell 206 can be reduced.

Figure 2C:
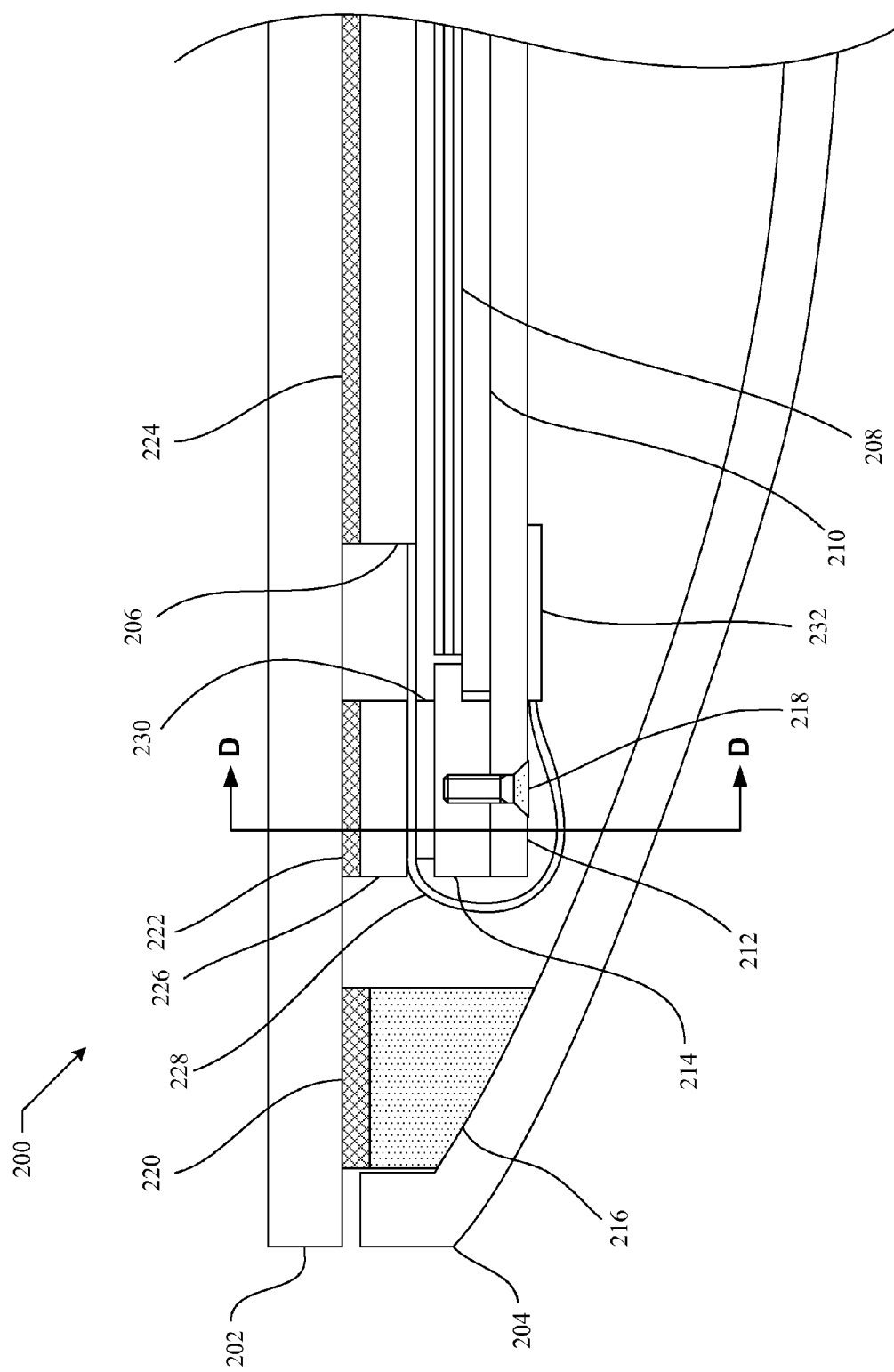
FIG. 2C shows a cross-sectional view of a computing device including an LCD module along an edge containing driver circuits for the LCD module.

FIG. 2C shows a cross-sectional view of computing device 200 along an edge that includes driver integrated circuits (ICs) 232 and flexible cables 228 for coupling driver ICs 232 to LCD cell 206. As depicted in FIG. 2A, driver ICs 232 can be located along a top edge of an LCD module. However, in another embodiment, driver ICs 232 can be located on any edge or multiple edges of the LCD module. Thus, the present disclosure is not limited to embodiments in which driver ICs 232 are located along the top edge of the LCD module. Driver ICs 232 can be mounted to support frame 212 or any suitable location. In another embodiment, driver ICs 232 can be included on the TFT glass layer included in LCD cell 206. In yet another embodiment, driver ICs 232 can be mounted on a different structural support such as structural housing 204.

When driver ICs 232 are mounted in an area outside of the LCD module, a modification of mounting bracket 214 can be needed to allow flexible cables 228 to pass through. Mounting bracket 214 can be shortened to allow clearance for flexible cables 228. Furthermore, spacer 226 can be bonded to cover glass layer 202 to create a pass-through space for flexible cables 228 between mounting bracket 214 and spacer 226. Spacer 226 can be formed from similar materials to mounting bracket 214 and can be bonded to cover glass layer 202 with the same foam adhesive 222 as mounting bracket 214. Any unfilled space between mounting bracket 214 and spacer 226 after passing through flexible cables 228 can be filled by gasket 230. Gasket 230 can be formed from foam or any other compliant material that can avoid imparting wear damage on flexible cables 226. A seal from gasket 230 can prevent foreign materials and particles from collecting near light guide 210 or optical films 208. More detail regarding the interface between spacer 226, mounting bracket 214, and flexible cables 228 can be seen in cross sectional view D-D, shown in FIG. 2D.

Figure 2D:
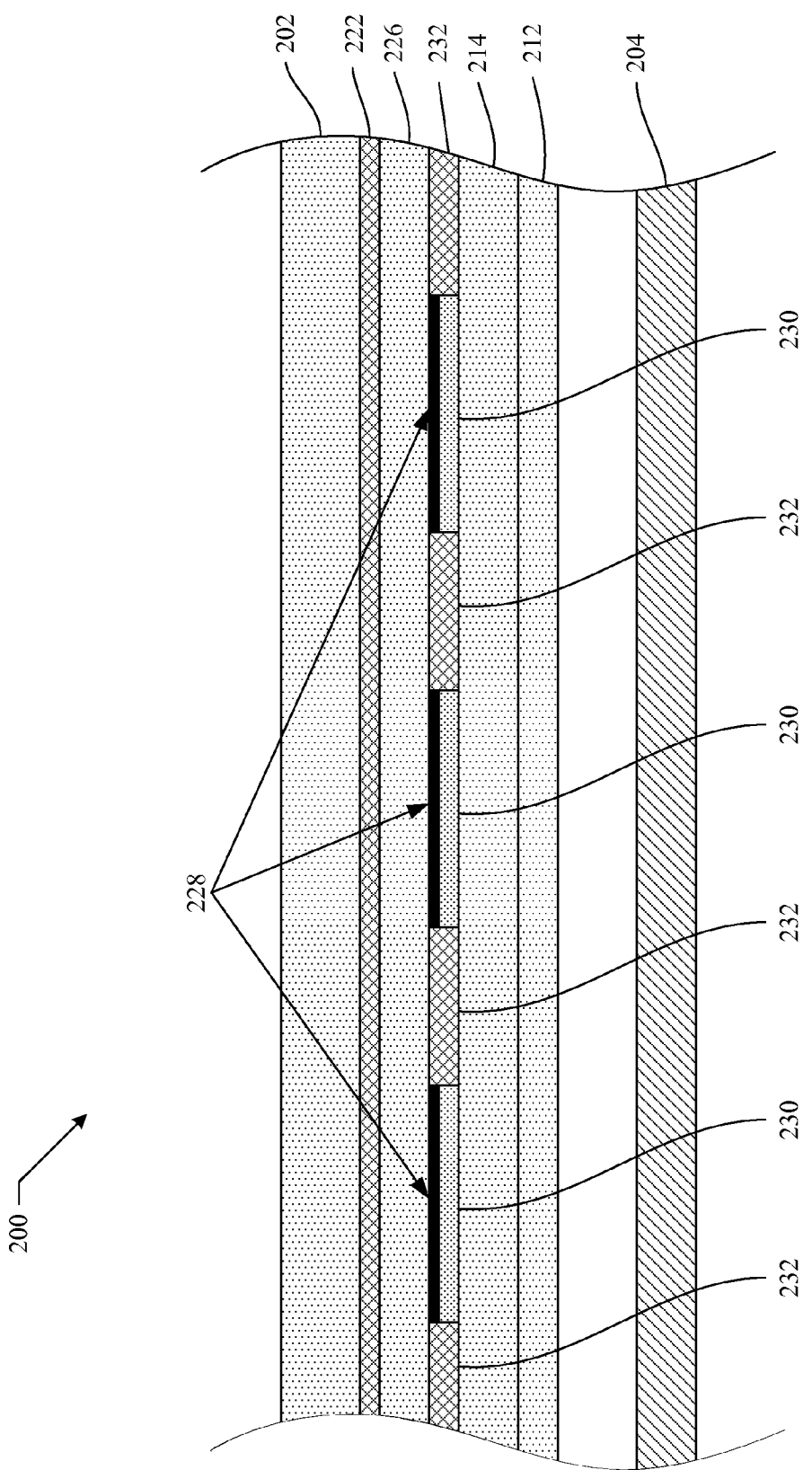
FIG. 2D shows a cross-sectional view of driver circuits for an LCD module passing through a mounting bracket.

FIG. 2D shows a cross-sectional view of computing device 200 showing how flexible cables 228 can pass through mounting bracket 214 when the backlight assembly is coupled to cover glass layer 202. Multiple flexible cables 228 can extend from LCD cell 206 to driver ICs 232 mounted outside of the LCD module. In one embodiment, flex cables 228 can be spaced evenly along an edge of the LCD module. Spacer 226 can be bonded to cover glass layer 202 using foam adhesive 222, forming one side of a pass through space for flexible cables 228. Mounting bracket 214 can be coupled to support frame 212 using fasteners or any other suitable means and can form another side of the pass through space. Foam gaskets 230 and adhesive 232 can alternatively be placed along the pass through space to seal the LCD module from foreign materials and particles. In one embodiment, a specialized tape with alternating sections of adhesive and foam gasket can be used to aid in an assembly process. In another embodiment, plastic spacers can be used in place of adhesive 232. In yet another embodiment, spacer 206 or mounting bracket 214 can be configured to have sections that extend outward and replace adhesive 232. Foam adhesive 222 can absorb and distribute local stress concentrations caused by structural loads, mismatched surfaces and differing thermal expansion rates between spacer 226 and cover glass layer 202. This can reduce stress concentrations in cover glass layer 202 that can lead to stress induced birefringence in LCD cell 206.

Figure 2E:
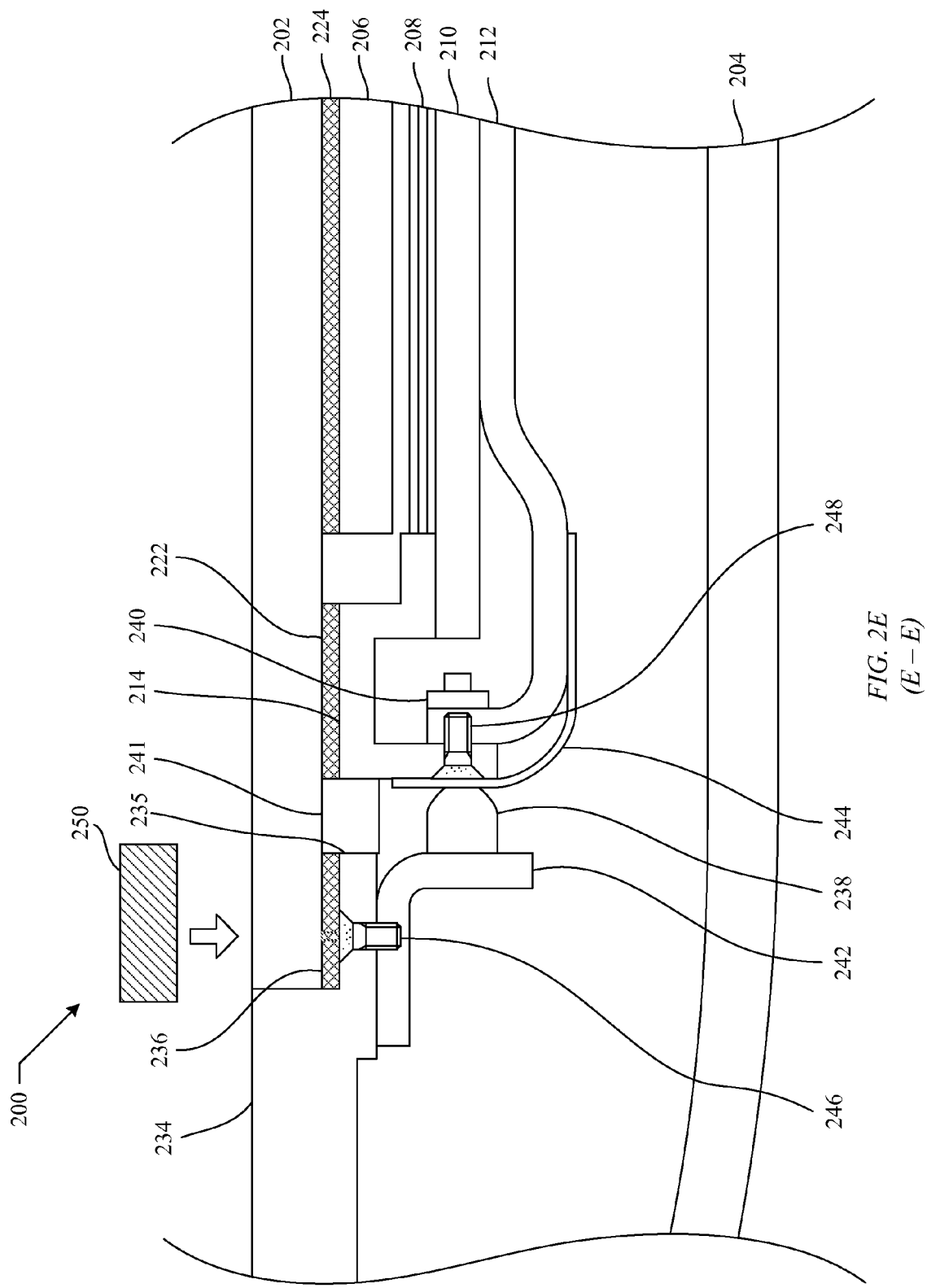
FIG. 2E shows a cross-sectional view of a computing device including an LCD module along an edge containing an illumination source and structural supports.

FIG. 2E shows a cross-sectional view of computing device 200 along an edge that includes illumination source 240 and various structural supports. As depicted in FIG. 2A, illumination source 240 can be located along a bottom edge of an LCD module. However, in another embodiment, illumination source 240 can be located on any edge or multiple edges of the LCD module. Thus, the present disclosure is not limited to embodiments in which illumination source 240 is located along the bottom edge of the LCD module. Illumination source 240 can be coupled to support frame 212 and can represent any suitable light source, including light emitting diodes (LEDs), fluorescent lamps, incandescent light bulbs, and electroluminescent panels. In one embodiment, support frame 212 can be formed from a thermally conductive material such as aluminum, steel, or graphite to act as a heat sink for illumination source 240. In another embodiment, illumination source 240 and support frame 212 can also be thermally coupled to chin structure 234, providing an additional heat sink for illumination source 240.

Mounting bracket 214 can be shaped differently along an edge that includes illumination source 240 to accommodate variations in support frame 212. However, mounting bracket 214 can still be attached to cover glass layer 202 using foam adhesive 222 to mitigate stress concentrations in cover glass layer 202. In addition, mounting bracket 214 can attach to support frame 212 along a side to leave space for illumination source 240 if necessary. Furthermore, mounting bracket 214 can be coupled to support frame 212 using any mechanically robust means. In one embodiment, mounting bracket 214 can be fastened to support frame 212 by fasteners 248. Using fasteners can be advantageous if rework or repair of the LCD module may be required.

When the cross section depicted in FIG. 2E is located along a bottom edge of an LCD module, additional support structures can be included to support the weight of cover glass layer 202 and the backlight assembly. Chin structure 234 can be located below cover glass layer 202 and form a forward surface of computing device 200 along a bottom edge of the device. Chin structure 234 can be formed from aluminum, steel, hi-strength thermoplastics, or a similar material. Chin structure 234 can be attached to cover glass layer 202 using adhesive 236. Adhesive 236 can be formed from any suitable adhesive, including foam adhesive and pressure sensitive foam adhesive. Adhesive 236 can form a continuous and compliant bond along a bottom edge of cover glass layer 202. Furthermore, adhesive 236 can absorb and distribute local stress concentrations caused by structural loads, mismatched surfaces and differing thermal expansion rates between chin structure 234 and cover glass layer 202. This can reduce stress concentrations in cover glass layer 202 that can lead to stress induced birefringence in LCD cell 206

In one embodiment, adhesive 236 can represent a pressure sensitive adhesive configured to form a bond when placed under sufficient pressure. When manufacturing computing device 200, force can be applied to cover glass layer 202 above pressure sensitive adhesive 236 to form a bond between chin structure 234 and cover glass layer 202. This force can be transmitted through cover glass layer 202 and into chin structure 234. However, in some embodiments, chin structure 234 can provide insufficient structural support to withstand a load necessary to activate pressure sensitive adhesive 236. One method for overcoming this problem can be to use magnet 250 to pull chin structure 234 upwards into cover glass layer 202. A magnetic material can be placed in or on chin structure 234 and magnet 250 can be placed above pressure sensitive adhesive 236 and configured to apply enough force to sufficiently bond cover glass layer 202 to chin structure 234. In one embodiment, L-bracket 242 can be formed from a magnetic material such as steel and positioned against chin structure 234 in an area below pressure sensitive adhesive 236. When magnet 250 is introduced during an assembly process, magnetic forces acting on L-bracket 242 can push chin structure 234 upwards into cover glass layer 202, applying a force adequate to activate pressure sensitive adhesive 236. See FIG. 10 for a flow chart detailing a process for activating pressure sensitive adhesive 236 using magnet 250. In another embodiment, suction cups or a vacuum can be used to exert an upward force sufficient to activate pressure sensitive adhesive 236.

In addition, chin structure 234 can provide vertical support to cover glass layer 202. When computing device 200 is placed in an upright position, chin structure 234 can be configured so that a bottom edge of cover glass layer 202 rests on a ledge forming a surface of chin structure 234. Thus, chin structure 234 can support the weight of cover glass layer 202. This can reduce an amount of shear stress that is placed on foam adhesives 236 and 220 from supporting the weight of cover glass layer 202. Due to the compliance of these foam adhesives, constant shear stress can cause cover glass layer 202 to drift downwards over time if adequate support is not provided by chin structure 234 or a similar structure.

Structural supports can also be provided for the backlight assembly. L-bracket 242 can be mechanically coupled to chin structure 234. In one embodiment, L-bracket 242 can be fastened to chin structure 234 by fasteners 246. In another embodiment, L-bracket 242 can be bonded to chin structure 234 with an adhesive. In yet another embodiment, L-bracket 242 and chin structure 234 can be integrated into one part. L-bracket 242 can be formed in shapes other than an angle extrusion. For example, if more stiffness is required, L-bracket 242 can be formed from a solid square bar or any other suitable shape. L-bracket 242 can be coupled to mounting bracket 214 and support frame 212 by gasket 238. In one embodiment, gasket 238 can be an EMI shielding gasket for providing local protection from electromagnetic fields. Furthermore, conductive fabric 244 can be provided to create a conductive path from support frame 212 to gasket 238. When L-bracket 242 is made from a conductive material such as steel, this can provide a conductive path between support frame 212 and chin structure 234. In another embodiment, chin structure 234 can act as a thermal heat sink, especially when illumination sources 240 are positioned near by chin structure 234, and chin structure 234 can be formed from a material that can conduct heat away from illumination sources. 240.

In another embodiment, a load bearing shim 241 can be included to share, in part, the load imparted by cover glass layer 202 to chin structure 234. Measurements can be made to determine a distance from a lower face of mounting bracket 214 to chin structure 214, and more particularly to undercut portion of chin structure 235. The load bearing shim 24l can be sized to fill a gap between undercut portion of chin structure 235 and mounting bracket 214 such that the weight of the backlight assembly is supported by chin structure 234, cover glass layer 202 and mounting bracket 214. This can reduce an amount of shear stress that is placed on foam adhesive 222 from supporting the weight of the backlight assembly. Due to the compliance of these foam adhesives, constant shear stress can allow the backlight assembly to drift downwards over time if adequate support is not provided by chin structure 234 and L-bracket 242 or a similar structure.

Figure 2F:
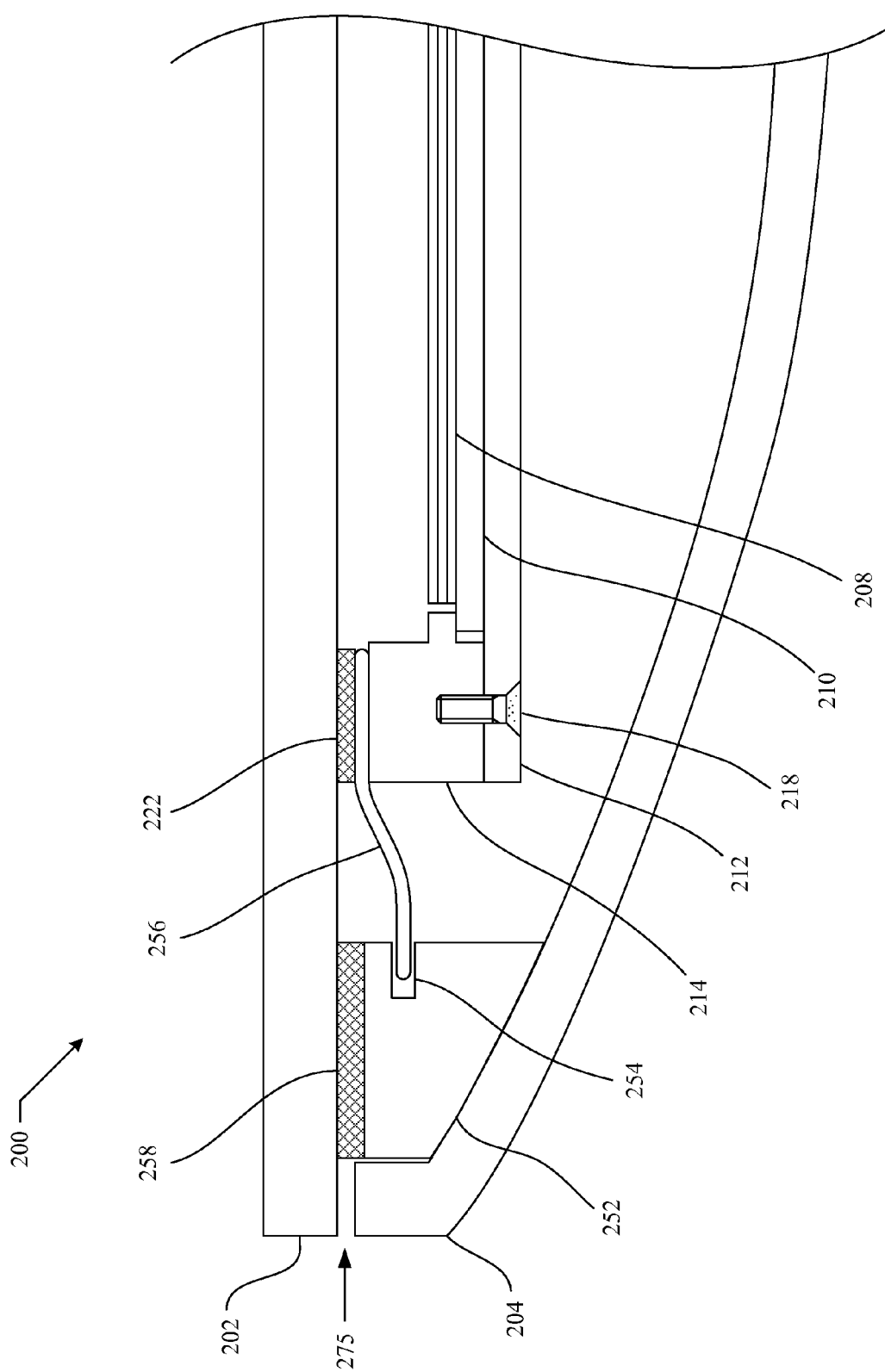
FIG. 2F shows a cross sectional view of an upper edge of a computing device showing another embodiment for attaching cover glass layer to the computing device.

FIG. 2F shows a cross sectional view of an upper edge of computing device 200 showing another embodiment for attaching cover glass layer 202 to computing device 200. Structural housing assembly 204 can include a support block 252 with a groove 254 formed into one of the edges. As described above, support block 252 can be formed from a plastic resin, or from metal such as steel or aluminum. Support block 252 can be attached to structural housing 204 with any technically feasible method such as bonding with an adhesive, welding (when the support block 252 is formed from metal or a metal alloy) or support block 252 can be drilled and tapped and held in place with one or more screws inserted through the structural support block 252. In one embodiment, support block 252 can only be attached to housing 204 along one surface (along the spline curve of housing 204 as shown). By providing a gap between housing 204 and support block 252, differential expansion and contraction rates can be supported, particularly when support block 252 is formed from a different material than housing 204. In one embodiment, a foam pad 258 can be disposed on support block 252.

A simplified version of the LCD module is shown in FIG. 2F. Some elements related to the LCD module have been removed from this view to simplify the view. In one embodiment, tongue 256 can be attached to mounting bracket 214. Support frame 212 can support light guide 210 and optical films 208 as described above. Foam adhesive can attach tongue 256 and mounting bracket 214 to cover glass layer 202. In another embodiment, tongue 256 can be formed integral to mounting bracket 214.

To attach cover glass layer 202 to housing 204, tongue 256 can be positioned into groove 254. In one embodiment, a lower portion of cover glass layer 202 can be tilted away from the housing 204 to facilitate the entry of tongue 256 into groove 254. After tongue 256 is positioned at least partially into groove 254, then the lower portion of the cover glass layer 202 can be moved into a final position. Referring back to FIG. 2E, additional fasteners can be used to attach one or more fasteners through L-bracket 242 to at least a portion of the mounting bracket 214. The position of fastener 248 can show an exemplary position of these additional fasteners.

A stepped cutter can cut a face of support block 252 with respect to one edge of housing 204. In one embodiment, the stepped cutter can help provide a well defined association between the one edge of housing 204 and the face of support block 252 such that the face of the support block 252 in cooperation with foam pad 258 can provide a well controlled cosmetic gap 275.

Figure 2G:
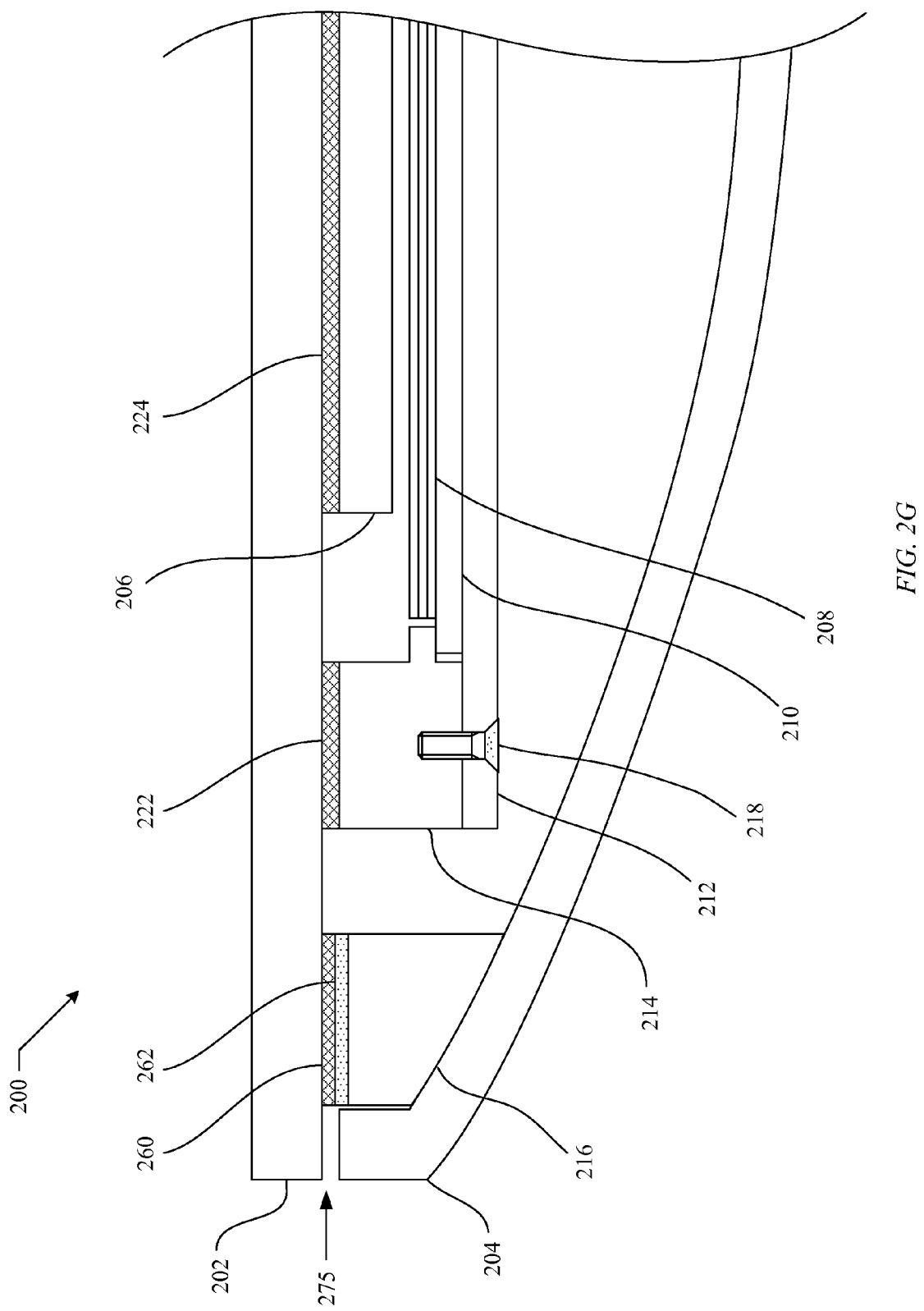
FIG. 2G shows a cross sectional view of an upper edge of computing device showing yet another embodiment for attaching cover glass layer to computing device.

FIG. 2G shows a cross sectional view of an upper edge of computing device 200 showing yet another embodiment for attaching cover glass layer 202 to computing device 200. This embodiment, although similar to the foam adhesive 220 approach of FIG. 2B, can use magnets and steel plates to secure cover glass layer 202 to housing 204. As described above, cover glass layer 202 can include mounting bracket 214, and support frame 212 where light guide 210 and optical film 208 can be disposed thereon.

Support block 216 can be attached to housing 204 in any manner as described above. In this embodiment, one or more magnets 262 can be attached to support block 216. Magnets 262 can be formed from any technically feasible means. In one embodiment, magnets 262 can be neodymium magnets. One or more steel plates 260 can be attached to cover glass layer 202 and positioned so that the cover glass layer 202 can be aligned with respect to housing 204 when the magnets 262 are brought into position with steel plates 260. In other embodiments, steel plates 260 can be replaced with any other objects including enough ferrous content to be attracted to magnets 262.

Support block 216 can be disposed about the periphery of housing 204. Magnets 262 can be disposed along support block 216 spaced by a distance d such that single point loads from individual magnets 262 to the cover glass layer 202 are minimized thus mitigating stress concentrations in cover glass 202. A height of the magnets 262, steel plates 260 and support block 216 can cooperatively control the cosmetic gap 275.

Figure 3A:
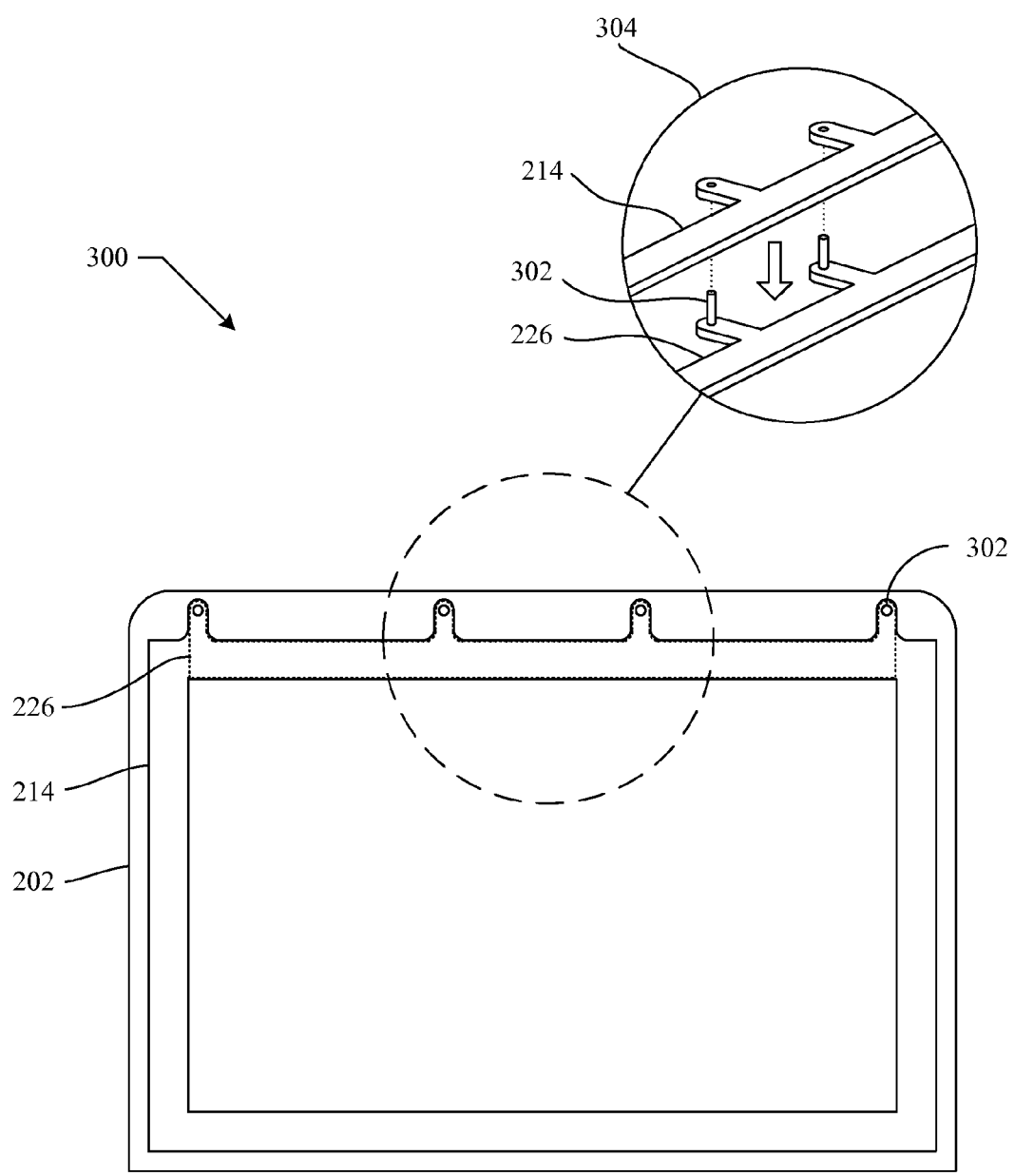
FIG. 3A shows a plan view of a mounting bracket attached to a cover glass layer.

FIG. 3A shows cover glass assembly 300, demonstrating how mounting bracket 214 and spacer 226 can be bonded to cover glass layer 202 prior to installation of the backlight assembly. Cover glass layer 202 is shown with a rear surface facing upwards. Spacer 226 and mounting bracket 214 can be bonded to cover glass layer 202 using foam adhesive 222. Foam adhesive 222 can be applied in a constant path along a bottom surface of mounting bracket 214 and spacer 226 to minimize stress transferred to cover glass layer 202 from mounting bracket 214 and spacer 226. Spacer 226 can include mounting posts 302 for aligning spacer 226 with mounting bracket 214. Enlarged view 304 shows how mounting bracket 214 can be inserted over mounting posts 302 to align mounting bracket 214 with spacer 226. In one embodiment, mounting posts 302 can be used for other purposes as well, such as lining up a camera with a viewing hole in cover glass layer 202. Mounting posts 302 can exist in any number or shape. In one embodiment, no mounting posts can be provided and mounting bracket 214 can be aligned to spacer 226 using a tool or automated assembly process.

Figure 3B:
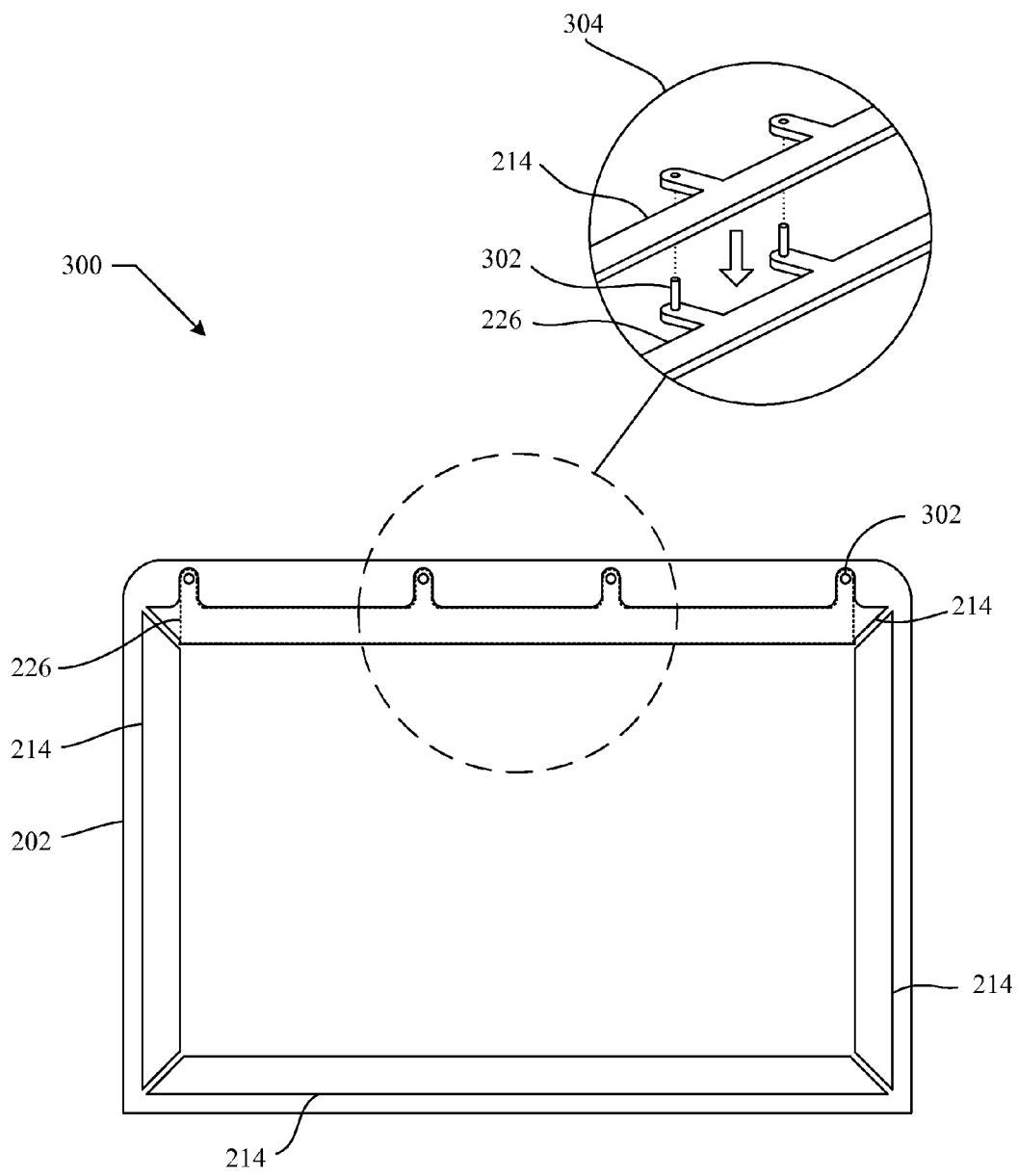
FIG. 3B shows a plan view of a segmented mounting bracket attached to a cover glass layer.

FIG. 3B shows another embodiment in which mounting bracket 214 is split into four pieces. Breaking mounting bracket 214 into multiple pieces can decrease an amount of stress transferred to cover glass layer 202 due to differences in thermal expansion between mounting bracket 214 and cover glass layer 202. Mounting bracket 214 can be split in many locations and it is not necessary that the splits be in corners. Moreover, the number of resulting pieces of mounting bracket 214 can be more or less than four. When gaps are left between segments of mounting bracket 214, foam gaskets can be inserted in the gaps to prevent leakage of light from the LCD module.

Figure 4:
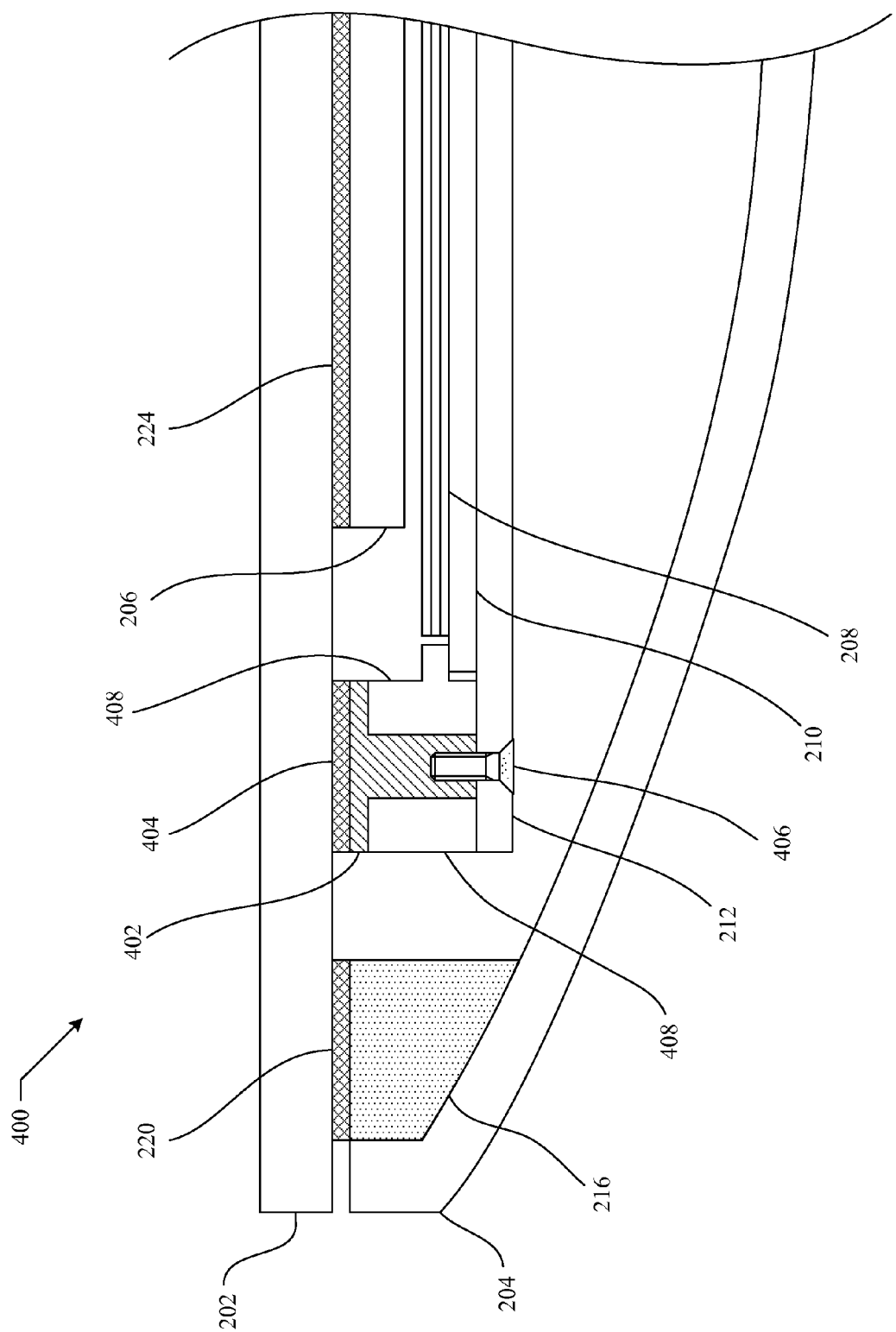
FIG. 4 shows a cross-sectional view along an edge of a computing device including an LCD module in which rigid plates attached to a cover glass layer support a backlight assembly.

FIG. 4 shows a cross-sectional view of computing device 400, demonstrating an alternative means of attaching the backlight assembly to cover glass layer 202. Rather than bonding mounting bracket 408 to cover glass layer 202, a series of rigid plates 402 can be bonded to cover glass layer 202 using adhesive 404. Rigid plates 402 can be formed from any hi-strength, rigid material. In one embodiment, steel plates can be used. Rigid plates 402 can include standoffs with threaded inserts placed at regular intervals. Support frame 212 can be fastened to rigid plates 402 using fasteners 406, and mounting bracket 408 can include slots for the standoffs in rigid plates 402 to pass through. Stresses applied from the backlight assembly can be distributed over a larger area due to the resilience of rigid plates 402 before being transmitted to the cover glass layer. By reducing stress concentrations in cover glass layer 202, the likelihood that stress induced birefringence will occur in LCD cell 206 can be reduced.

Figure 5:
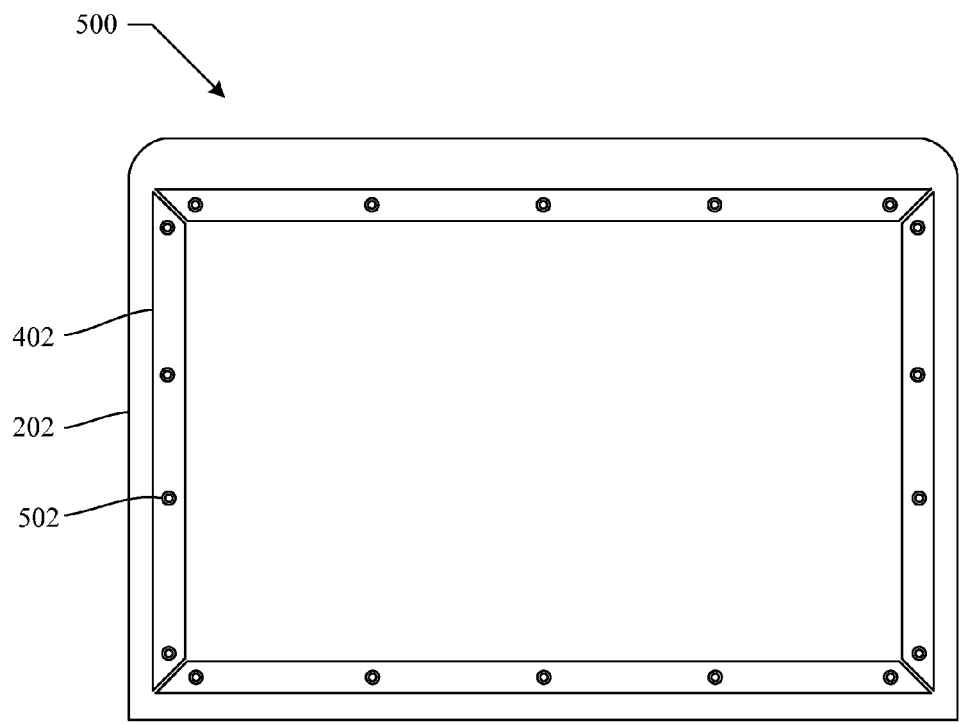
FIG. 5 shows a plan view of rigid plates attached to a cover glass layer.

FIG. 5 shows cover glass assembly 500, demonstrating how rigid plates 402 can be bonded to cover glass layer 202 prior to installation of mounting bracket 408 and the backlight assembly. Cover glass layer 202 is shown with a rear surface facing upwards. Rigid plates 402 can be bonded directly to cover glass layer 202 using an adhesive. Standoffs 502 can be incorporated into rigid plates 402 and spaced at regular intervals. Rigid plates 402 can be split into multiple sections to reduce an amount of stress transferred to cover glass layer 202 due to differences in thermal expansion between rigid plates 402 and cover glass layer 202. Rigid plates 402 can be split in many locations and the splits can be in locations other than the corners. Moreover, the number of resulting pieces of rigid plate 402 can be more or less than four. When gaps are left between segments of rigid plates 402, foam gaskets can be inserted in the gaps to prevent leakage of light from the LCD module.

Figure 6:
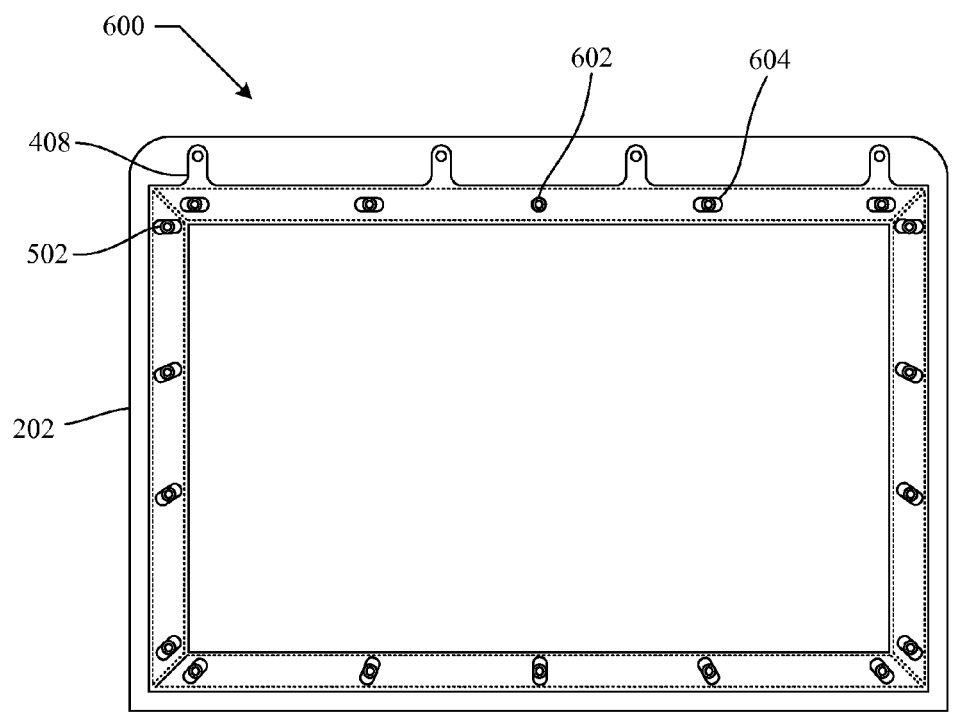
FIG. 6 shows a plan view of a mounting bracket and rigid plates attached to a cover glass layer.

FIG. 6 shows cover glass assembly 600 with mounting bracket 408 included. Mounting bracket 408 can include a combination of holes and slots to allow standoffs from rigid plates 402 to pass through. If rigid plates 402 and mounting bracket 408 are made from different materials, slots can be strategically located to minimize stress due to varying thermal expansion rates. Locating hole 602 can be provided in an area where tighter tolerances are required. For example, a camera placed near locating hole 602 can require higher tolerances to line up with a corresponding hole in cover glass layer 202. All of the remaining slots 604 in mounting bracket 408 can then be oriented towards locating hole 602 so that any uneven thermal expansion will occur along a direction commensurate with slots 604. In this manner, cover glass layer 202 can avoid stress created from unequal thermal expansion between rigid plates 402 and mounting bracket 408.

Figure 7:
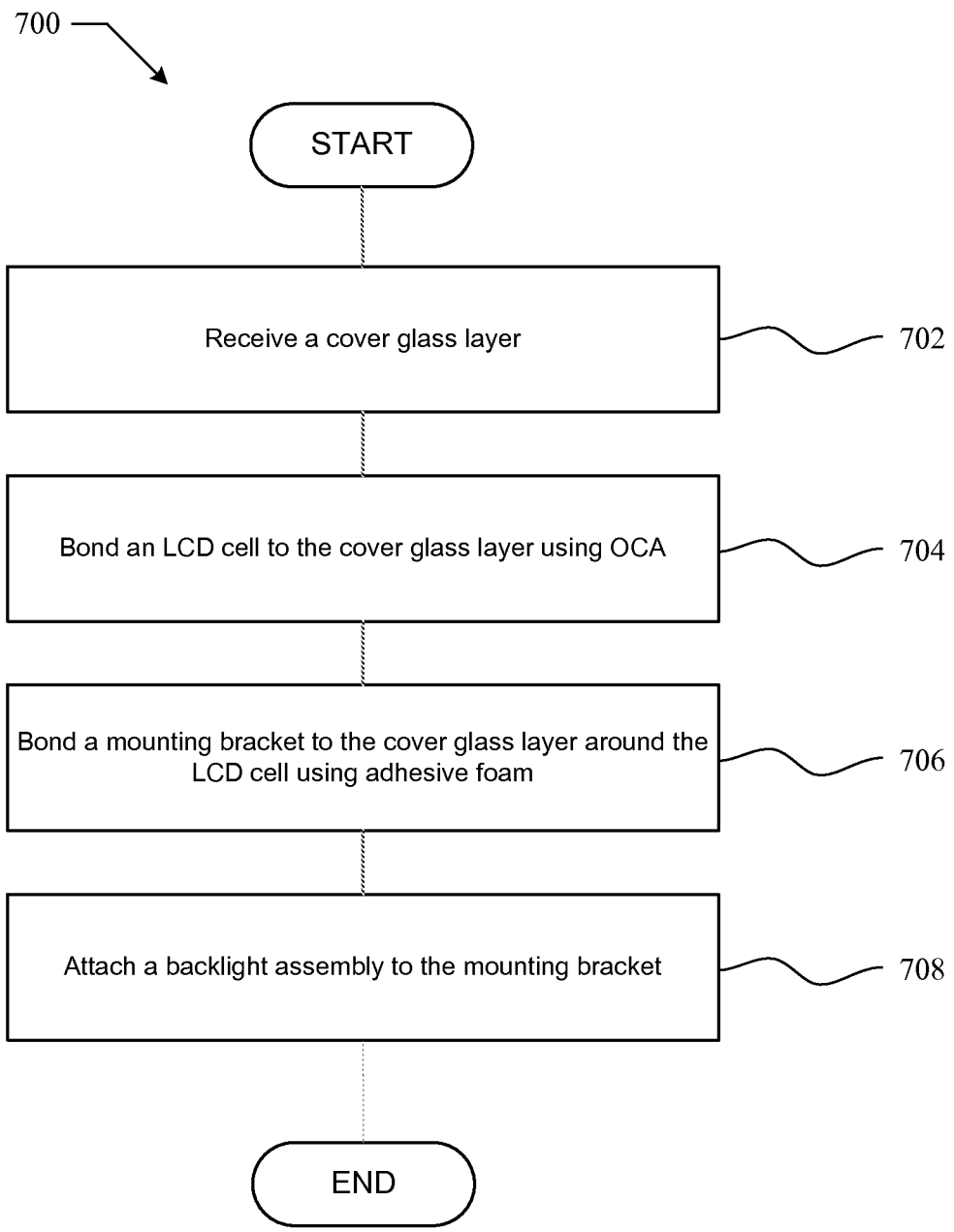
FIG. 7 shows a flow chart describing a process for attaching a backlight assembly to a cover glass layer using a foam adhesive.

FIG. 7 shows process 700 for attaching a backlight assembly to a cover glass layer using a foam adhesive. In step 702, a cover glass layer can be received. In step 704, an LCD cell can be bonded to the cover glass layer using an optically clear adhesive. In step 706, a mounting bracket can be bonded to the cover glass layer in an area around the LCD cell using a foam adhesive. The foam adhesive can form a constant and compliant bond along the length of the mounting bracket. The compliant bond can absorb and distribute local stress concentrations caused by structural loads, mismatched surfaces and differing thermal expansion rates between the mounting bracket and the cover glass layer. This can reduce stress concentrations in the cover glass layer that can lead to stress induced birefringence in the LCD cell. Finally, in step 708, a backlight assembly can be attached to the mounting bracket using fasteners or an adhesive. The backlight assembly can include an illumination source, light guide, optical films, and a support frame.

Figure 8:
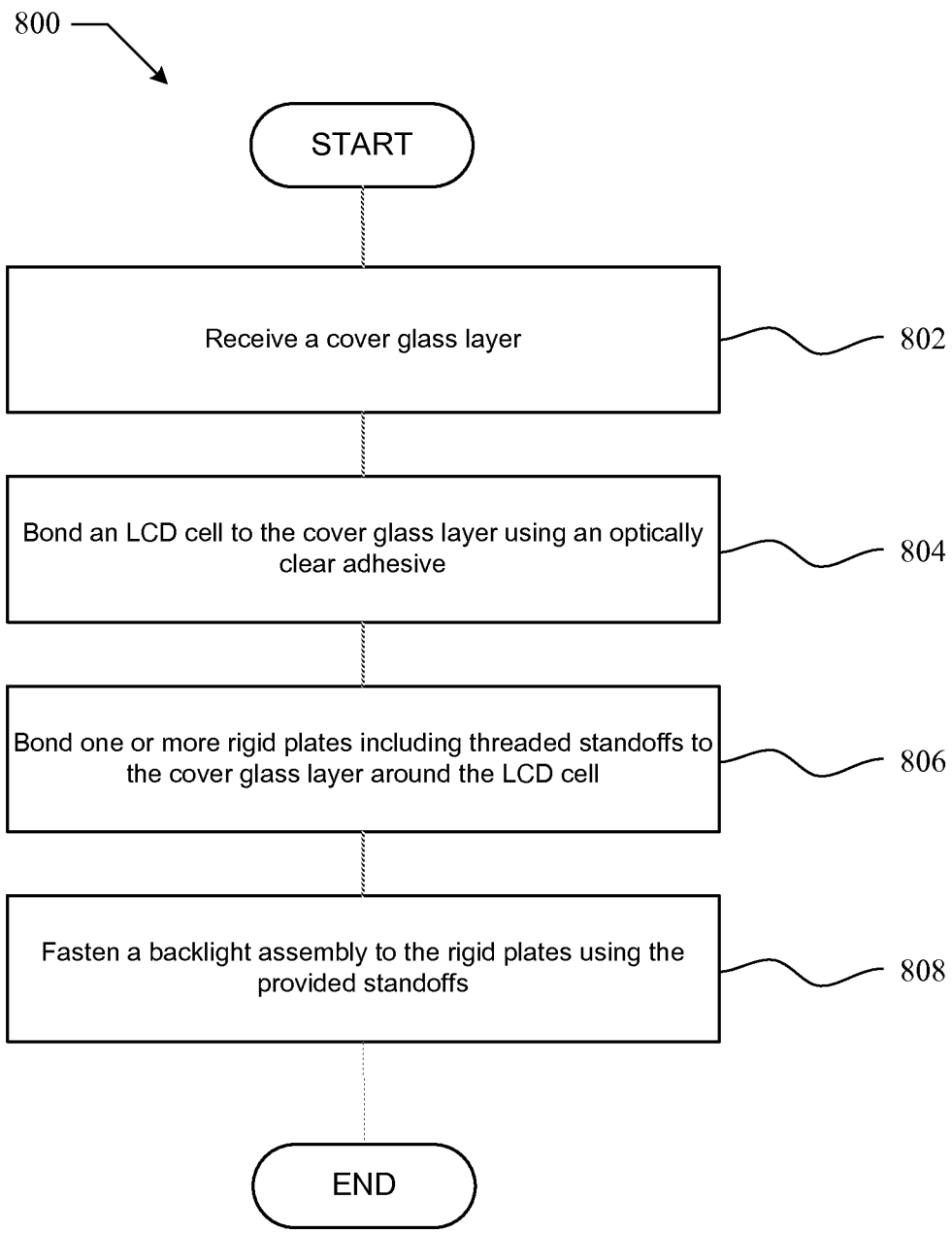
FIG. 8 shows a flow chart describing a process for attaching a backlight assembly to a cover glass layer using rigid plates.

FIG. 8 shows process 800 for attaching a backlight assembly to a cover glass layer using a rigid plate assembly. In step 802, a cover glass layer can be received. In step 804, an LCD cell can be bonded to the cover glass layer using an optically clear adhesive. In step 806, one or more rigid plates can be bonded to the cover glass layer in an area around the LCD cell using an adhesive. Stresses applied from the backlight assembly can be distributed over a larger area due to the resilience of rigid plates 402 before being transmitted to the cover glass layer. The rigid plates can include standoffs threaded to receive one or more fasteners. Finally, in step 808, a backlight assembly can be attached to the rigid plates by using fasteners to engage the threaded standoffs. The backlight assembly can include an illumination source, light guide, optical films, and a support frame. In another embodiment, a mounting bracket can be placed over the rigid plates before installing the backlight assembly. The mounting bracket can include holes or slots to accommodate the threaded standoffs, and can be used to retain optical films or other components of the LCD module.

Figure 9:
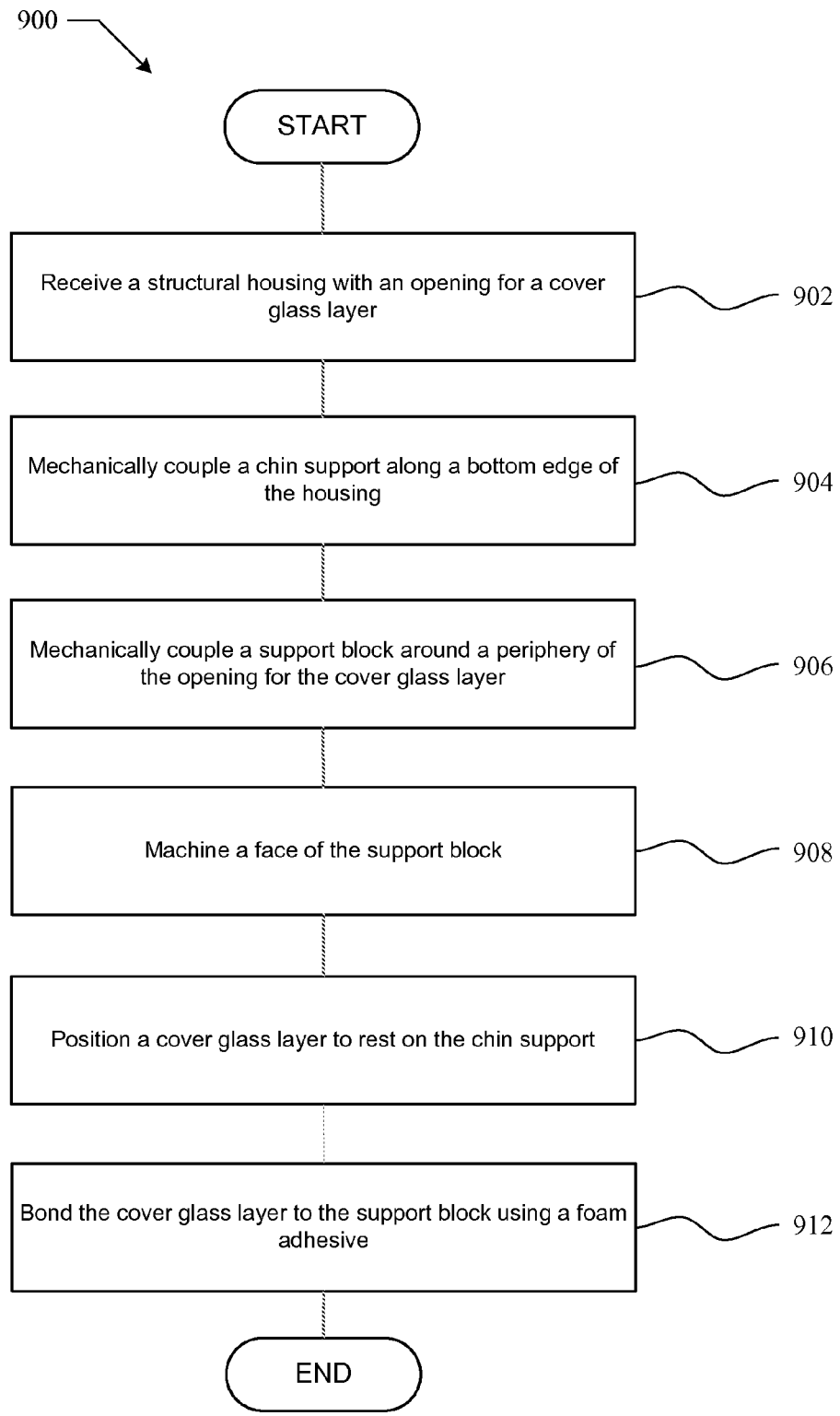
FIG. 9 shows a flow chart describing a process for attaching a cover glass layer to a structural housing using a foam adhesive.

FIG. 9 shows process 900 for attaching a cover glass layer to a structural housing while minimizing an amount of stress imparted to the cover glass from the structural housing. In step 902, a structural housing including an opening for an LCD module can be received. The structural housing can form an exterior surface of a device or be an internal structural feature. In step 904, a chin support can be mechanically coupled to the structural housing along a lower edge. The chin support can be configured to support the weight of a cover glass layer along a lower edge of the cover glass layer. In another embodiment, the chin structure and structural housing can be integrated into one part. In step 906, a support block can be mechanically coupled to the structural housing around a periphery of the opening for the cover glass layer. The support block can be coupled by any robust means, including adhesives, adhesive tape, fasteners, or welding. The support block can provide a surface for a later bonding operation. If the structural housing has sufficient thickness around the periphery of the opening for the cover glass layer to form a bonding surface, then steps 906 and 908 can be omitted. In step 908, a face of the support block can be machined to provide a uniform surface for bonding. An edge of the structural housing can be used as a reference for the machining operation. This can create a uniform gap along an edge of the device, enhancing the user experience. The face of the support block can be machined to sit slightly below the edge of the structural housing to allow room for an adhesive. In step 910, a cover glass layer can be positioned so that a bottom edge of the cover glass rests on the chin support. Finally, in step 912, the cover glass layer can be bonded to the support block using a continuous and compliant foam adhesive. In one embodiment, double sided foam adhesive tape can be used and a roller mechanism can apply a uniform pressure to the cover glass layer along the bonding path to seal the bond. The foam adhesive can absorb and distribute local stress concentrations, reducing an amount of stress transferred to the cover glass layer.

Figure 10:
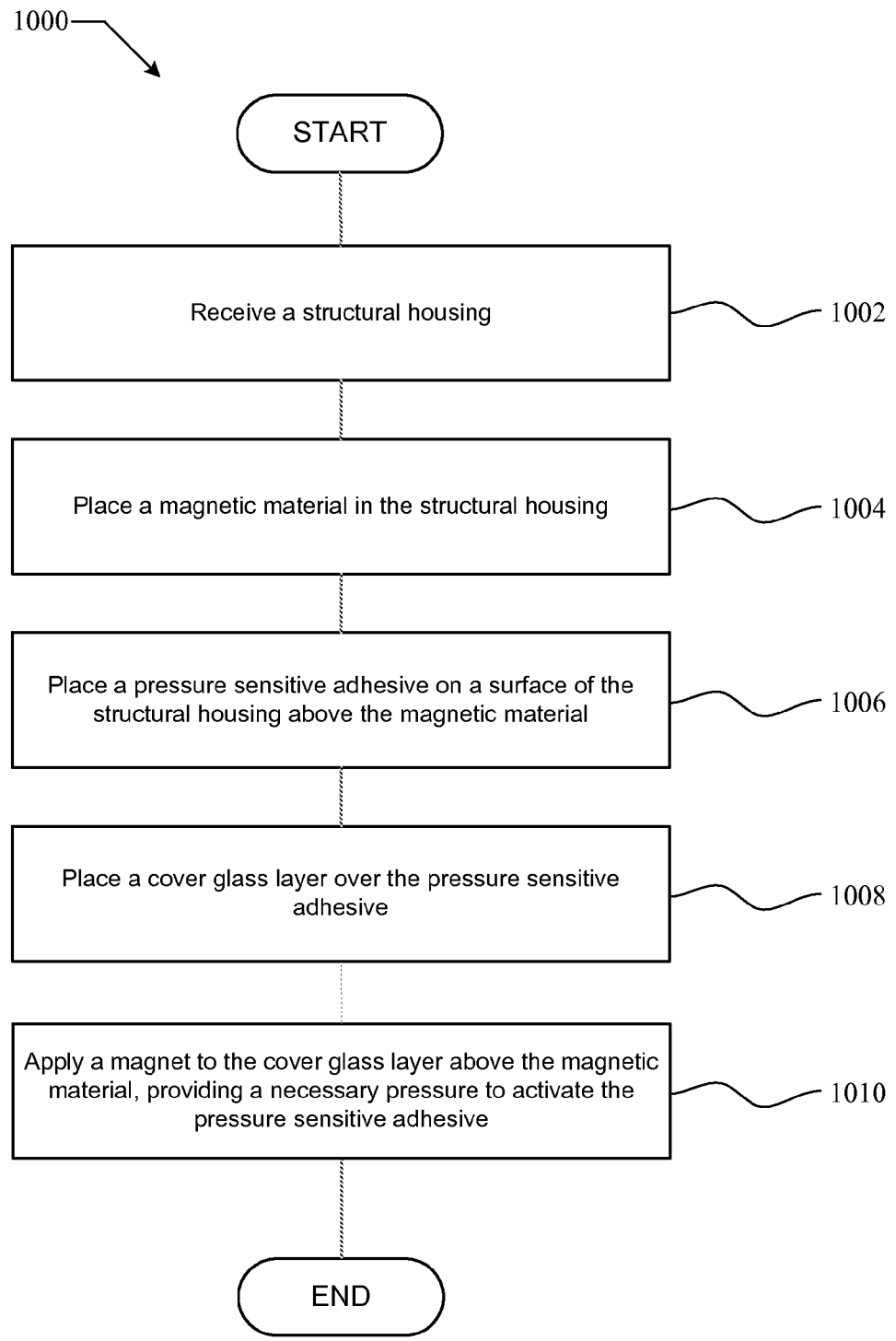
FIG. 10 shows a flow chart describing a process for activating a pressure sensitive foam adhesive using a magnetic force.

FIG. 10 shows process 1000 for activating a pressure sensitive adhesive used to bond a cover glass layer to a structural housing. In step 1002, a structural housing can be received. In step 1004, a magnetic material can be placed inside the structural housing. The magnetic material can be placed in an area below a surface on which a pressure sensitive adhesive is to be applied. In one embodiment, a structural member within the structural housing can be made from a magnetic material such as steel. In step 1006, a pressure sensitive adhesive can be placed on a surface of the structural housing above the magnetic material. The pressure sensitive adhesive can be configured to bond adequately when a pre-defined force is applied normal to the pressure sensitive adhesive. In step 1008, a cover glass layer can be placed over the pressure sensitive adhesive. Finally, in step 1010, a magnet can be applied externally along a surface of the cover glass layer above the pressure sensitive adhesive. The magnet can be configured and oriented to impart a force on the magnetic material, pulling the magnetic material upwards and providing the force necessary to activate the pressure sensitive adhesive.

Figure 11:
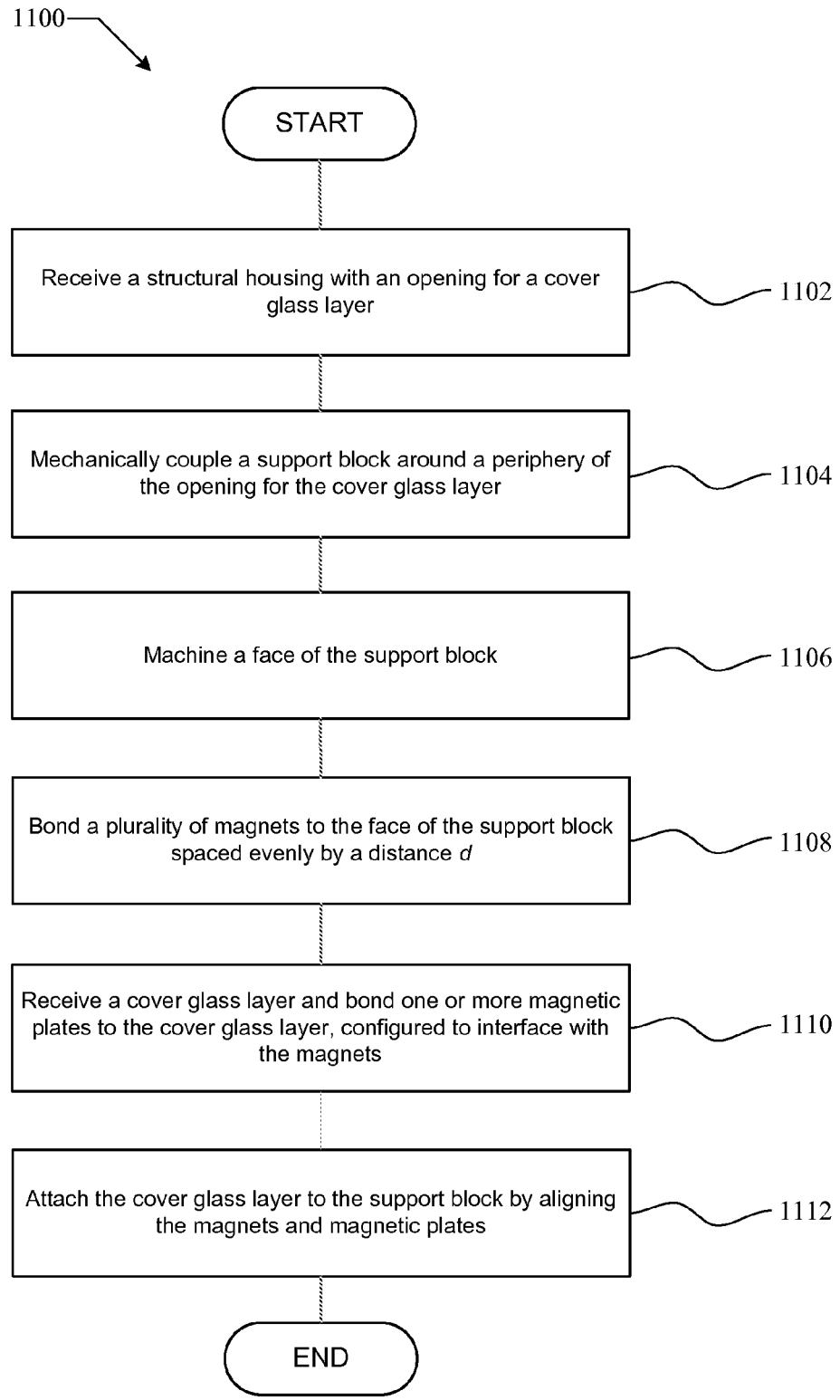
FIG. 11 shows a flow chart describing a process for attaching a cover glass layer to a structural housing using magnets.

FIG. 11 shows process 1100 for attaching a cover glass layer to a structural housing using magnets. In step 1102, a structural housing including an opening for an LCD module can be received. The structural housing can form an exterior surface of a device or be an internal structural feature. In step 1104, a support block can be mechanically coupled to the structural housing around a periphery of the opening for the cover glass layer. The support block can be coupled by any robust means, including adhesives, adhesive tape, fasteners, or welding. The support block can provide a surface for a later bonding operation. If the structural housing has sufficient thickness around the periphery of the opening for the cover glass layer to form a bonding surface, then steps 1104 and 1106 can be omitted. In step 1106, a face of the support block can be machined to provide a uniform surface for bonding. An edge of the structural housing can be used as a reference for the machining operation. This can create a uniform gap along an edge of the device, enhancing the user experience. The face of the support block can be machined to sit slightly below the edge of the structural housing to allow room for magnets. In step 1108, a plurality of magnets can be bonded to the machined face of the support block. The magnets can be spaced evenly along the support block and separated from each other by a distance d. Distance d can be configured to adjust a degree to which point loads can be transferred from the support block to a cover glass layer. For example, a smaller distance d can allow for greater distribution of loads applied a cover glass layer from the support block. In step 1110, a cover glass layer can be received and bonded to one or more metal plates. The magnetic plates can be formed from any magnetic material, such as nickel or steel. Furthermore, the magnetic plates can be configured to align with the magnets bonded to the support block. Finally, in step 1112, the cover glass layer can be attached to the supporting block by aligning the magnets on the supporting block with the magnetic plates on the cover glass layer.

Figure 12:
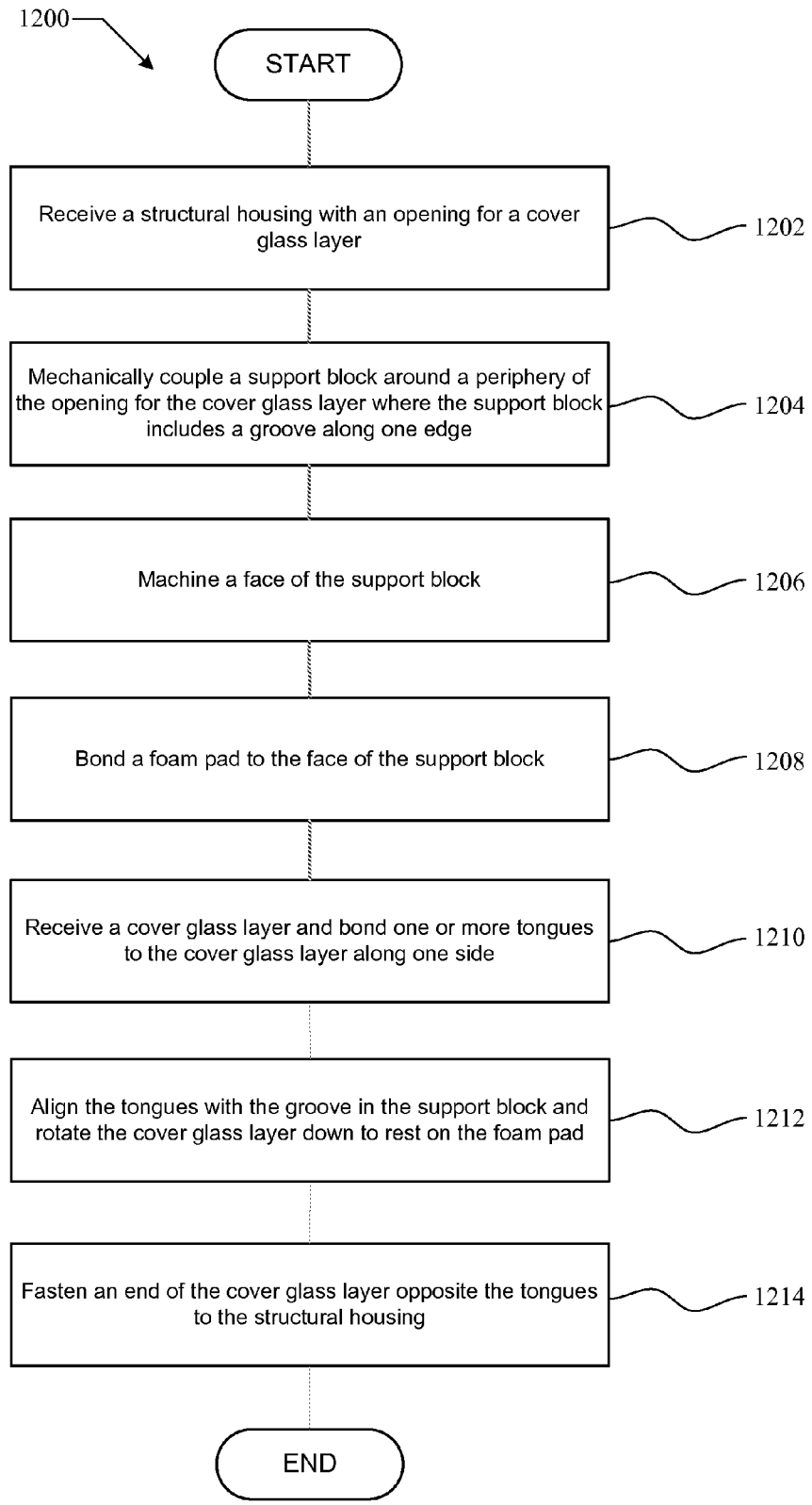
FIG. 12 shows a flow chart describing a process for attaching a cover glass layer to a structural housing using a tongue and groove design.

FIG. 12 shows process 1200 for attaching a cover glass layer to a structural housing using a tongue and groove design. In step 1202, a structural housing including an opening for an LCD module can be received. In step 1204, a support block can be mechanically coupled to the structural housing using means similar to step 1104 in process 1100. The support block can have a groove configured to receive one or more tongues along an interior face of one edge of the opening for the LCD module. In step 1206, a face of the support block can be machined using means similar to step 1106 in process 1100. In step 1208, a foam pad can be bonded to the machined face of the support block. In step 1210, a cover glass layer can be received and one or more tongues can be bonded to the cover glass layer along one edge. In another embodiment, the tongues can be bonded or fastened to a mounting bracket coupled to the cover glass layer. In step 1212, the tongues can be aligned to enter the groove in the support block and the cover glass layer can be rotated down to rest on the foam pad. Finally, in step 1214, an end of the cover glass layer opposite the tongues can be fastened to the structural housing.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A computing device, comprising:
   a housing comprising a support structure;
   a display cover adhered to the support structure by an adhesive layer; and
   a bracket fastened to the support structure, wherein the bracket is magnetic, wherein
   the adhesive layer is positioned between the bracket and the display cover, and wherein a magnetic field of an external magnet placed in proximity to the display cover near the bracket exerts a force on the bracket that pulls the bracket toward the display cover and compresses the adhesive layer.

2. The computing device of claim 1, wherein a portion of the support structure is positioned between the bracket and the adhesive layer.

3. The computing device of claim 1, wherein the adhesive layer comprises a pressure sensitive foam adhesive.

4. The computing device of claim 1, wherein the adhesive layer maintains a uniform gap between the support structure and the display cover.

5. The computing device of claim 1, wherein the bracket is mechanically coupled to the support structure.

6. The computing device of claim 1, wherein the display cover is positioned within a groove of the support structure.

7. A computing device comprising:
   a structural housing forming an exterior surface of the computing device;
   a cover glass layer;
   a chin structure disposed along a bottom edge of the structural housing, wherein the structural housing and the chin structure form an opening;

a support block coupled to the structural housing and disposed along a periphery of the opening, wherein the support block comprises:
  a first surface supporting the cover glass layer, and a second surface coupled to the structural housing;
a pressure sensitive compliant adhesive material coupled to the cover glass layer and the support block that maintains a uniform gap between the structural housing and the cover glass layer; and
a magnetically responsive material within the structural housing arranged such that the pressure sensitive compliant adhesive material is positioned between the magnetically responsive material and the support block, wherein the magnetically responsive material exerts a force on and activates the pressure sensitive compliant adhesive material in response to a magnetic field of an external magnet.

8. The computing device defined in claim 7, wherein:
the cover glass layer is bonded to an LCD cell using an optically clear adhesive, the LCD cell further comprising a thin film transistor glass layer, liquid crystals and a color filter;
the chin structure is integrally coupled to the structural housing, and the structural housing and the chin structure cooperate to form the opening for the cover glass layer;
the first surface of the support block is substantially parallel to a front surface of the computing device and supports an interior surface of the cover glass layer, and the second surface is coupled to an interior surface of the structural housing;
the pressure sensitive compliant adhesive material reduces an amount of point loads that can be transferred from the structural housing to the cover glass layer; and
the magnetically responsive material exerts the force on and activates the pressure sensitive compliant adhesive material in response to the magnetic field of the external magnet placed in proximity to the cover glass layer near the magnetically responsive material.

9. The computing device defined in claim 7 wherein the pressure sensitive compliant adhesive material includes a foam adhesive.

10. The computing device defined in claim 9 wherein the foam adhesive further comprises a foam layer with adhesive tape bonded to opposing surfaces of the foam layer.

11. The computing device defined in claim 7, wherein the cover glass layer is coupled to the structural housing using:
at least one magnet coupled to the support block; and
at least one magnetic plate bonded to an interior surface of the cover glass layer, wherein the at least one magnetic plate is aligned with the at least one magnet coupled to the support block.

12. The computing device defined in claim 11, wherein the at least one magnet comprises a continuous magnet disposed on the first surface of the support block around the periphery of the opening for the cover glass layer.

13. The computing device defined in claim 11, wherein the at least one magnetic plate comprises a continuous magnetic plate disposed along a periphery of the cover glass layer, the continuous magnetic plate aligned with the at least one magnet.

14. A method for attaching a cover glass layer to a structural housing while reducing an amount of stress imparted to the cover glass layer, comprising:
  coupling a chin structure to a structural housing that forms an exterior surface of a computing device, the chin structure coupled along a bottom edge of the structural housing, wherein the structural housing and the chin structure combine to form an opening for the cover glass layer;
  coupling a first surface of a support block to the structural housing along a periphery of the opening for the cover glass layer;
  machining a second surface of the support block so that the second surface is substantially parallel to a front surface of the computing device and supports an interior surface of the cover glass layer;
  bonding the cover glass layer to an LCD cell using an optically clear adhesive, the LCD cell further comprising a thin film transistor glass layer, liquid crystals and a color filter;
  coupling the cover glass layer to the support block using a pressure sensitive compliant adhesive material reducing an amount of point loads that can be transferred from the structural housing to the cover glass layer and maintain a uniform gap between the structural housing and the cover glass layer; and
  positioning a magnetically responsive material within the structural housing such that the pressure sensitive compliant adhesive material is positioned between the magnetically responsive material and the support block, wherein the magnetically responsive material exerts a force on and activates the pressure sensitive compliant adhesive material in response to a magnetic field of an external magnet placed in proximity to the cover glass layer near the magnetically responsive material during an assembly process.

15. The method as recited in claim 14, wherein the pressure sensitive compliant adhesive material includes a foam adhesive.

16. The method as recited in claim 15, wherein the foam adhesive further comprises a foam layer with pressure sensitive adhesive disposed on opposing surfaces of the foam layer.

17. The method as recited in claim 14, wherein machining the second surface of the support block further comprises:
  sensing the position of an edge of the structural housing; and
  machining the second surface of the support block to be a uniform distance from the edge of the structural housing, wherein the uniform distance allows a constant gap to exist between the cover glass layer and the structural housing after assembly.

18. The method as recited in claim 14, wherein coupling the cover glass layer to the support block further comprises:
  bonding a plurality of magnets along the second surface of the support block;
  bonding a plurality of magnetic plates to an interior surface of the cover glass layer, wherein the plurality of magnetic plates align with the plurality of magnets; and
  coupling the cover glass layer to the second surface of the support block by aligning the plurality of magnets with the plurality of magnetic plates.

19. The method as recited in claim 18, wherein the plurality of magnetic plates are bonded to the second surface of the support block and the plurality of magnets are bonded to the interior surface of the cover glass layer.

* * * * *